United States Patent [19]

Iwamatsu et al.

[11] Patent Number: 5,648,988
[45] Date of Patent: *Jul. 15, 1997

[54] COMMUNICATION SYSTEM INCLUDING A DIGITAL ROLL-OFF FILTER

[75] Inventors: Takanori Iwamatsu; Norihide Mitsuta, both of Kawasaki, Japan

[73] Assignee: Fujitsu Limited, Kanagawa, Japan

[*] Notice: The term of this patent shall not extend beyond the expiration date of Pat. No. 5,495,501.

[21] Appl. No.: 573,075

[22] Filed: Dec. 15, 1995

Related U.S. Application Data

[63] Continuation of Ser. No. 122,530, Sep. 28, 1993, Pat. No. 5,495,501.

[30] Foreign Application Priority Data

| Sep. 2, 1992 | [JP] | Japan | 4-233956 |
| Sep. 7, 1992 | [JP] | Japan | 4-237847 |
| Sep. 1, 1993 | [WO] | WIPO | PCT/JP93/01236 |

[51] Int. Cl.$^6$ .............. H03H 7/30; H03H 7/40
[52] U.S. Cl. .............. 375/232; 375/229; 375/234; 375/235; 364/724.2; 381/103
[58] Field of Search .............. 375/229, 230, 375/232, 235, 233, 234, 266; 364/724.2; 381/103

[56] References Cited

U.S. PATENT DOCUMENTS

| 3,560,855 | 2/1971 | Schroeder | 375/232 |
| 3,617,948 | 11/1971 | Lucky | 333/18 |
| 3,633,107 | 1/1972 | Brady | 325/305 |
| 3,978,407 | 8/1976 | Forneg, Jr. et al. | 375/235 |
| 4,097,807 | 6/1978 | Fujimura | 325/42 |
| 5,050,186 | 9/1991 | Gurcon et al. | 364/724.2 |
| 5,175,747 | 12/1992 | Murakami | 375/232 |
| 5,321,723 | 6/1994 | Mizoguchi | 375/230 |
| 5,327,459 | 7/1994 | Hara et al. | 375/232 |

OTHER PUBLICATIONS

IEEE Journal of Solid–State Circuits, vol. 23, No. 5, Meier et al. "A2 m CMOS Digital Adaptive Equalizer Chip for QAM Digital Radio Modems" Oct. 1988.

*Primary Examiner*—Wellington Chin
*Assistant Examiner*—William Luther
*Attorney, Agent, or Firm*—Helfgott & Karas, P.C.

[57] ABSTRACT

A transversal type digital roll-off filter receiving a signal n-time sampled from analog signal carrying a pulse train of symbol rate T, includes a transversal type delay line including a plurality of delay elements each having a delay time T/n. Nodes are positioned between adjacent two delay elements. The filter further includes a memory for providing first tap rating ratios to control signals of the nodes and a calculation circuit for monitoring pulse forms of the output signal of the filter, and calculating second ratios to additionally control a central node and every n-th node counted from the central node, where the second ratios are calculated to make the output pulse good in shape. The filter acts as a roll-off filter and as an automatic equalizer. In a method of diagnosing the circuits in the above system, a memory in a transmitter further has second tap rating ratios used to diagnose the system, where the first and second ratios are switchably output to a digital filter in the transmitter. The second tap rating ratios allow the first filter itself alone to output good-shape pulses. The method includes the steps of switching the first memory to output the second ratios and comparing an eye diagram with a reference level, at a point after the first filter, to determine a cause of deteriorating the pulse forms.

14 Claims, 19 Drawing Sheets

COMMUNICATION SYSTEM INCLUDING A DIGITAL ROLL-OFF FILTER

This is a continuation, of application Ser. No. 08/122,530, filed Sep. 28, 1993 now U.S. Pat. No. 5,495,501.

TECHNICAL FIELD

This invention relates to a communication system employing a digital roll-off filter.

BACKGROUND ART

A quadrature amplitude modulation, referred to hereinafter as QAM, has been increasingly employed in a multi-channel digital communication system due to its high efficiency capability. Concept of a system configuration of a typical QAM communication system is schematically illustrated in FIG. 1. Explanation will be given hereinafter representatively with the I channel because the circuit configurations of I and Q channels are symmetrical with each other. In a transmitting station, an internal frequency band (referred to hereinafter as IF) or a base band (both referred hereinafter to representatively as IF) of an I channel and a Q channel are input to input terminals of first digital roll-off filters $102ai$ and $102aq$, respectively. Circuit configuration of roll-off filters will be described later in detail. Frequency characteristics of the first roll-off filters are determined by the tap rating ratios stored in a first read-only memory, referred to hereinafter as a ROM, 113.

Output of first roll-off filter $102ai$ is input to a digital-to-analog (referred to hereinafter as D/A) converter $131i$. Unnecessary higher frequency spectrum generated in the output of D/A converter $131i$ is eliminated by a low-pass filter $132i$. Outputs from low-pass filters $132i$ and $132q$ respectively of the I channel and Q channel are input to a QAM modulator 134, to which an carrier frequency signal is also input from an carrier generator 133. A QAM modulated radio frequency signal is transmitted via a radio frequency amplifier (not shown in the figure) to a receiving station.

In the receiving station, a preamplifier (not shown in the figure) amplifies and converts the received radio frequency signal to an IF signal, which is then input to a QAM demodulator 154, to which a local frequency signal is input from a local frequency oscillator 156. I channel and Q channel signals output from QAM demodulator 154 is input via a low-pass filter $152i$ to an analog-to-digital (referred to hereinafter as A/D) converter $151l$. Each bit line of a parallel digital signal output from A/D converter $151i$ is input to a second roll-off filter $102bi$. Frequency transmission characteristic of second roll-off filter $102bi$ is determined by tap rating ratios stored in, and output from, a ROM 6-1.

Frequency characteristics of the first and second roll-off filters are chosen such that overall transmission characteristics, i.e. a total of the frequency characteristics of the two filters in each channel, allow the second roll-off filter to output signal pulses in an adequately good shape which causes no intermodulation in the QAM-modulated signals, as well as to eliminate unnecessary upper frequency spectrum generated from the circuits, such as D/A converter, etc.

Even though the overall frequency characteristics that are the sum of both the first and second roll-off filters are set so that the pulse form at the output at second roll-off filter is in a good shape, fading or some other factors in the transmission system always varies the transmission characteristics, such as frequency vs amplitude, or frequency vs phase-delay, which accordingly deteriorate the pulse forms output from the second roll-off filter.

In order to remedy this deterioration an automatic equalizer $160i$ is provided at the output of the second roll-off filter $102bi$. Output of second roll-off filter $102bi$ is input via a pulse divider $146i$, which returns the signal to have the symbol rate, to a first input terminal of automatic equalizer $160i$. Moreover, an output of roll-off filter $102bq$ of Q channel is input to a second input terminal of automatic equalizer $160i$ of the I channel. Symmetrically the same cross-connection is done in the Q channel.

Automatic equalizers are formed of roll-off filter, the frequency characteristics of which are variably determined by tap rating ratios given from a calculating circuit 7. Calculating circuit 7 is formed of a micro computer system which monitors the pulse formed of the signal output from the automatic equalizer $160i$ and calculates optimum values of the factors so that pulse form of the signal output therefrom is satisfactorily in a good shape.

The output signal is also input to an carrier regeneration circuit 155, the output of which is fed back to control local oscillator 156.

A problem of this circuit configuration is that the provision of the automatic equalizer causes a cost increase in manufacturing the receiving station.

A more important problem is that, when the frequency characteristics are deteriorated by some elements located after the first roll-off filter and the element which carried deteriorations must be urgently removed, it is impossible to locate that element by checking eye patterns of the waveforms at check points A1, A2, A3, B3, B2, B1 and B0, each located after the first roll-off filter, without time-consuming manual operations. This is because, even in a normal state where the second roll-off filter is outputting satisfactory waveforms the waveforms in the stages between the two roll-off filters are not in a good shape viewed in the eye diagram.

DISCLOSURE OF THE INVENTION

It is a general abject of the invention to provide a digital roll-off filter additionally having a function of an automatic equalizer, and a method of locating a cause of deterioration of a frequency characteristic of the transmission line employing the digital roll-off filter.

A transversal type digital roll-off filter receiving a single bit line of a parallel digital signal sampled n times from an analog signal carrying a pulse train having a pulse spacing T, comprises: a transversal type delay line having an even number of delay elements each having a delay time T/n; nodes positioned between adjacent two delay elements; a memory device for providing first tap rating ratios of control signals of the nodes, respectively; and a calculation circuit for monitoring pulse forms of an output signal of the roll-off filter, and calculating second tap rating ratios to additionally control a central one of the nods and every n-th nodes counted from the central nodes, where the second tap rating ratios are calculated so as to be optimum to make the output pulse forms good in shape. Thus, the delay line acts as a roll-off filter whose frequency characteristic is determined by the first tap rating ratios and acts as an automatic equalizer whose frequency characteristic is variably controlled by the second tap rating ratios.

In a method of diagnosing electronic circuits used in the above communication system, the first memory device further comprises a second kind of tap rating ratios to be used to diagnose the system, where the first and second tap rating ratios are switchably output to the first roll-off filter. A second memory device is provided, comprises a third kind of tap rating ratios to be used for diagnosing the system. The second kind tap rating ratios allow the first roll-off filter itself alone to output a satisfactorily good pulse shape at its output terminal, and the third kind of tap rating ratios allow the second roll-off filter to have a flat frequency characteristic. The method of diagnosing the system comprises the steps of switching a first memory device so as to output second kind tap rating ratios; and comparing a width or a height of an eye in an eye diagram with a predetermined reference level, at a check point provided at a circuit located after the first roll-off filter, so as to detect a location of a cause of deteriorations of the pulse forms.

The above-mentioned features and advantages of the present invention, together with other objects and advantages, which will become apparent, will be more fully described hereinafter, with references being made to the accompanying drawings which form a part of the applications, wherein like numerals refer to like parts throughout.

BRIEF DESCRIPTION OF THE DRAWINGS

FIG. 17($b$) shows frequency characteristics of the first digital roll-off filter of the ninth preferred embodiment;

FIG. 17($c$) shows frequency characteristics of the output signal from the first digital roll-off filter of the ninth preferred embodiment;

FIG. 18($b$) shows a practical eye diagram;

FIG. 19($b$) shows a wired logic circuit to detect a deterioration of the pulse forms is an analog circuit; and FIG. 19($c$) shows a wired logic circuit to detect a deterioration of the pulse forms on a digital circuit.

DETAILED DESCRIPTION OF THE PREFERRED EMBODIMENTS OF

Figure 2:
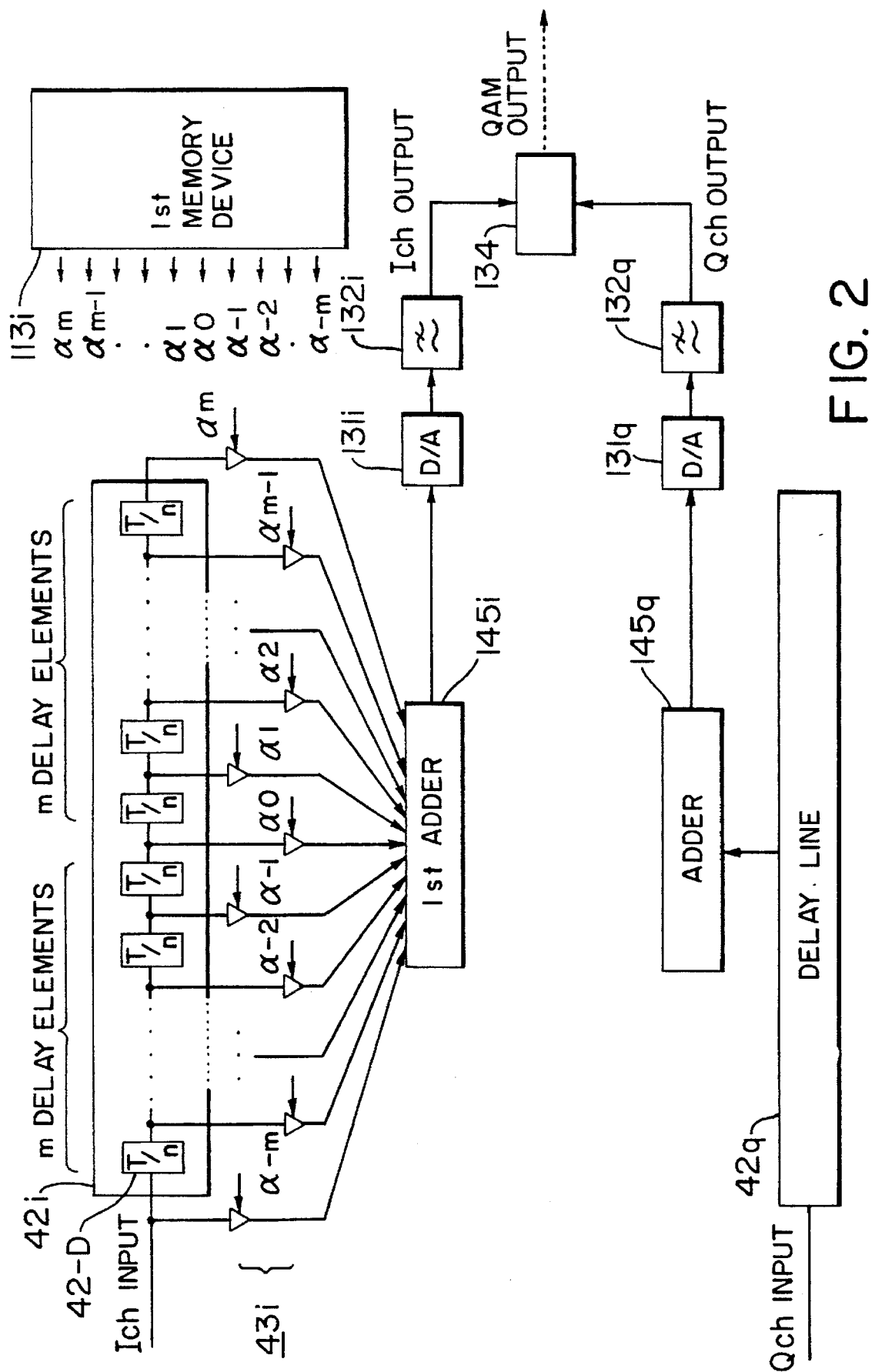
FIG. 2 illustrates a block diagram of a transmitting station of a first preferred embodiment of the present invention.
Figure 3:
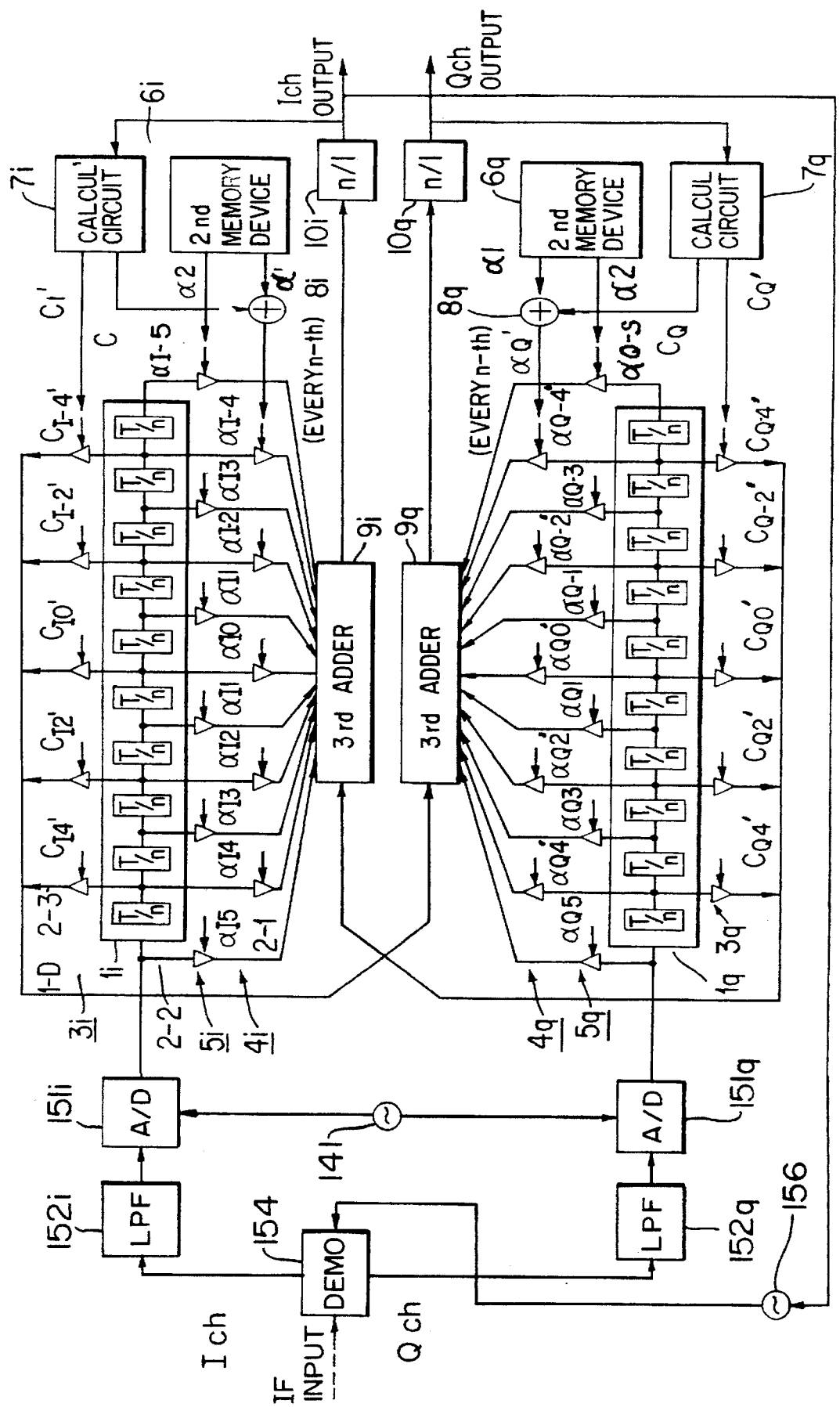
FIG. 3 illustrates a block diagram of a digital roll-off filter of a first preferred embodiment of the present invention.

A first preferred embodiment of the present invention is hereinafter described referring to FIG. 2 showing a principal part of a transmitter and FIG. 3 showing a principal part of a receiver. Same or like parts are denoted by corresponding reference numerals throughout the figures.

The input to the transmitting station is formed by digital signals, for example a base band, of an I channel and a Q channel, orthogonal with each other, which are parallel digital signals, for example of eight bits, having a symbol rate T. Detailed description of the circuit configuration will be hereinafter given representatively for I channel only.

Each bit line of the input signal is connected to an input terminal of each of delay lines 42$i$ of eight, in this case, first digital roll-off filters 102$ai$. Only one of the delay lines is representatively drawn for each channel in FIG. 3. Circuit configuration of the roll-off filters will be described later in detail.

Output of first roll-off filter 102$ai$ is input to a D/A converter 131$i$. Unnecessary higher frequency spectrum included in the output of D/A converter 131$i$ is eliminated by a low-pass filter 132$i$. Outputs from low-pass filters 132$i$ and 132$q$ respectively of the I channel and Q channel are input to a QAM modulator 134, to which an carrier frequency signal is also input from an carrier frequency oscillator 133. A QAM modulated radio frequency signal is transmitted via a radio frequency amplifier (not shown in the figure) to a receiving station.

Each roll-off filter 102$ai$ comprises a finite impulse response (referred to hereinafter as FIR) type transversal delay line 42$i$. FIR delay circuit 42$i$ is formed of a series of as many as 2$m$, an even number for example fourteen, delay elements 42-D. Each delay element 42-D is formed of, for example, a flip-flop having a delay time T/n, where T also shows pulse spacing of the pulse train input thereto and "n" is the sampling number, in this example, two. A branch line branches out from each of 2$m$+1 nodes connecting adjacent two delay elements. Each branch line is serially provided with a multiplier 43$i$. Signals output to the branch lines are multiplied at respective multipliers 43$i$ by first tap rating ratios $\alpha_m$—$\alpha_0$—$\alpha_{-m}$ output from a first memory device 113$i$, typically formed of a ROM (read-only memory). All of thus multiplied signals are summed by a first adder 145$i$. An output of first adder 145$i$, i.e. the sum, is the output of the first roll-off filter 102$ai$. Thus, FIR-type T/n delay line 42$i$, multipliers 43$i$, first memory device 113$i$ and adder circuit 45$i$ constitute the first digital roll-off filter 102$ai$. Frequency characteristic of first roll-off filter is determined by tap rating ratios $\alpha_m$—$\alpha_0$—$\alpha_{-m}$.

Figure 17A:
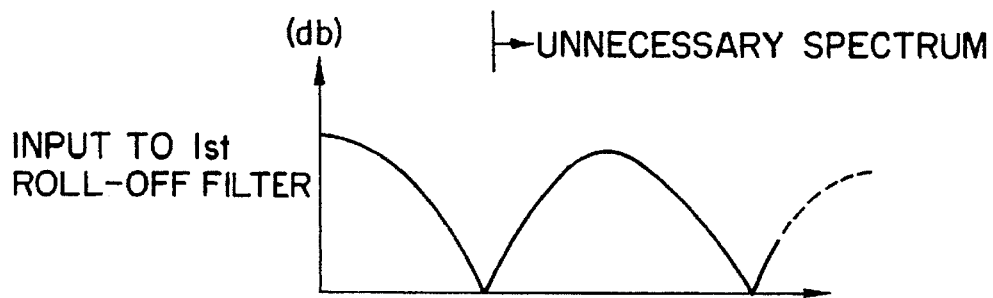
FIG. 17($a$) shows frequency characteristics of the first digital roll-off filter and an input signal thereto.

The frequency characteristic of the first roll-off filter is such that the unnecessary upper frequency spectrum input thereto shown in FIG. 17(a) is eliminated, and moreover provides, together with the output of the second roll-off filter in the receiver station, a good output pulse shape, as will be explained later in detail.

In the receiving station, a QAM modulated radio frequency signal received from the transmitter is pre-amplified as well as converted by a pre-amplifer and a frequency converter, each of which is not shown in the figure, to an IF signal. The IF signal is input to a demodulator 154 (FIG. 3), to which a local frequency signal is also input from local frequency oscillator 156. An I channel signal output from demodulator 154 is input to an A/D converter 152$i$, where the analog input signal is sampled n times, in the figures n=2, so as to output a parallel digital signal of 8-bit in this example. Unnecessary high frequency spectrum is eliminated by a low-pass-filter 151$i$ (FIG. 3). Each bit line signal output from low-pass-filter 151$i$ is input to a second FIR type transversal delay line 1 of second digital roll-off filter 110$i$. In the first preferred embodiment of the present invention, the second roll-off filter 110$i$ acts as a roll-off filter plus an automatic equalizer.

A delay line 1$i$ shown in (FIG. 3), is formed of a series of as many as 2$m$, an even number for example fourteen, elements 1-D. Each delay element 1-D is formed of, for example, a flip-flop having a delay T/n, where T is the pulse spacing of the original pulse train and "n" is sampling number of A/D converter 151$i$. There are as many as 2$m$+1 nodes each between adjacent two delay elements 1-D and at both of the input and output terminals of the delay line. A branch line, which may be called a tap, branches out of each nodes. A second group 2-3 of branch lines and a third group 2-1 of branch lines branch out of the center nodes of delay line 1$i$ and every n-th nodes counted from the center nod, totally as many as 2a+1, an odd number symmetric about the center node. Thus, the signals on the second and third branch lines are delayed by the period T from the adjacent branch lines. A fourth group 2-2 of branch lines branch out from all other nodes than those the second group and third group tap lines 2-3 and 2-1. In the figures of the present and the subsequent preferred embodiments n is 2; accordingly, every a two nodes are connected with the third group branch lines in the figure. If n=4, it is needless to say that every four nods are connected with the second and third group branch lines.

Each of second group branch lines 2-3 is serially provided with a multiplier of second group 3$i$. Each of third and fourth group branch lines 2-1 and 2-2 is serially provided with a multiplier circuit of a third and fourth group 4$i$ or 5$i$. Each of second group branch lines 2-3 is serially provided with a multiplier of second group 3$i$. Signals output to second group branch lines 2-3 are multiplied at a respective second multiplier 3$i$ by respective second group tap rating ratio C', that are $C_{q4'}$—$C_{q0'}$—$C_{-q4'}$, output from calculation circuit 7. Calculation circuit 7 will be explained later in detail. Signals output to third and fourth branch lines 2-1 and 2-2 are multiplied at respective multiplier circuits 4$i$ and 5$i$ by respective third and fourth group tap rating ratios $\alpha'$ and $\alpha_2$ ($\alpha i_5$—$\alpha i_0$—$\alpha$-$i_5$). Third tap rating ratios $\alpha'$ are of the below-described modifications of the outputs $\alpha 1$ from a second memory device 6 typically formed of a ROM. Between each of the third group multipliers 4$i$ and a second memory device 6$i$ is provided a second adder 8$i$, where a sixth group tap rating ratio $\alpha_1$ output from second memory device 6$i$ is added with a fifth group tap rating ratio C' output from a calculation circuit 7 so as to output a modified second group tap rating ratio $\alpha'$. Thus multiplied signals output from third and fourth group multipliers 4$i$ and 5$i$ are input to, and summed by, a third adder 9$i$.

Thus multiplied signals output from second group multipliers 3$i$ are input to a corresponding third adder circuit 9$q$ of the Q channel. Symmetrically in the same way, third adder 9$i$ of the I channel is input with the outputs of corresponding second group multipliers 3$q$ of Q channel. Accordingly, the sum of the multiplied signals from the third and fourth group multipliers 4$i$ and 5$i$ of the I channel and the multiplied signals from the corresponding second group multipliers 3$q$ of the Q channel are output from the third adder 9$i$ of the I channel. A digital output of third adder 9$i$ is divided by n by a divider 10$i$ so as to have the symbol rate. An output of the pulse divider 10$i$ is the output on a single bit line of the roll-off filter of the invention. The output is input to calculation circuit 7$i$. The output is also input to a carrier regeneration (CR) circuit 155, an output of which is fed back to control local oscillator 156.

When the automatic equalizer is not operated, the second and fifth group tap rating ratio C' and C, each being output from the respective calculation circuit 7, are kept zero. Then, frequency characteristics of the second roll-off filter are determined by fourth and sixth group tap rating ratios $\alpha 1$ and $\alpha 2$, which are all of fixed values.

Frequency characteristics of the first roll-off filter in the transmitter station and the second roll-off filter in the receiving station are chosen such that the overall frequency characteristics of the two roll-off filters allow the signal pulse output from the second roll-off filter without the use of an automatic equalizer function, to be in a satisfactorily good shape so that no intermodulation would take place between the QAM-modulated signals. With this condition the tap rating ratios are fixed and stored in both of first and second memory devices 113 and 6, respectively in the transmitter and in the receiver.

When the automatic equalizer is in operation calculation circuit 7 monitors the pulse form output from divider 10 and calculates most optimum value of each of the second and fifth tap rating ratios C' and C.

Figure 4:
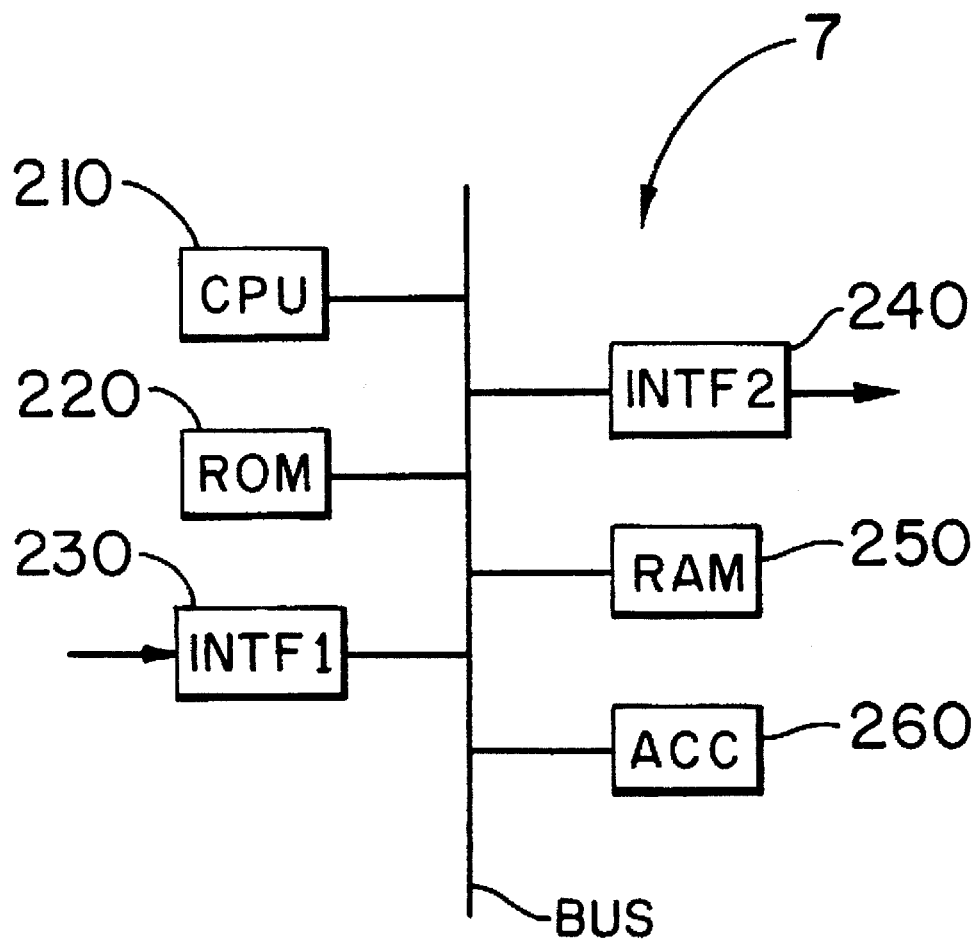
FIG. 4 illustrates a block of diagram of a circuit configuration of a calculation circuit.

The internal circuit configuration of calculation circuit 7 is illustrated in FIG. 4. Calculation circuit 7 comprises a microprocessor (CPU) 210, a program ROM 220, a first interface circuit 230, a second interface circuit 240, a RAM (random access memory) 150, and an accumulator 260. Processing program for the CPU 210 is stored in ROM 220. The procedure and an algorithm, i.e. the process programs, stored in ROM 220 are transferred to RAM 250; the data of pulse form input via first interface circuit 230 is compared with a predetermined reference level data; the optimum tap rating ratios to shape the pulse form are calculated according to the comparison result; and the optimum tap rating ratios C and C' are output via second interface circuit 240 to second adders 8 and second group multipliers 3. The algorithm is similar to those have been generally employed in the transversal filter type automatic equalizer.

The tap rating ratio to be input to an i-th branch multiplier is given as follows:

$$Ci = \int D(t) \oplus E\{t\} \, dt$$

where m is the node number counted from the center node;
  D(t) is a polarity value of the I and Q channel, respectively;
  E{t} is an error bit (at one bit lower than data bit);
  t is time in each symbol time; and
  $\oplus$ is an exclusive OR.

Figure 6:
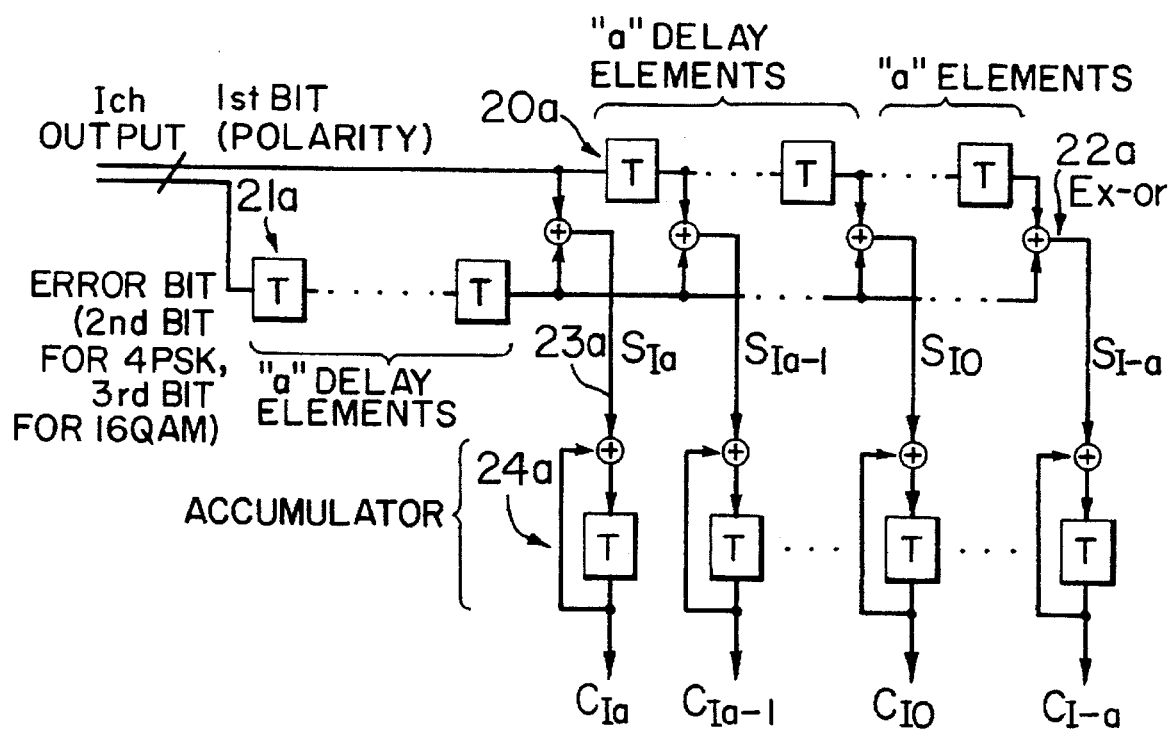
FIG. 6 illustrates a block diagram of a circuit of an accumulator of a second preferred embodiment of the invention.

The tap rating ratios Ci output from calculation circuit 7, shown in FIG. 4, are typically obtained with an accumulator circuit 260 shown in FIG. 6. The first bit indicating its polarity is input from the output of the second roll-off filter 110$i$ to a delay line 20$a$ formed of as many as 2$a$ delay elements each having a delay T. The bit indicating an error (typically a second bit for 4 PSK or a third bit for 16 QAM) is input to another delay line 21 formed of as many as "a" delay element each having a delay T. An output of delay line 2$i$ and an output from each nod of delay line 20 are input to each exclusive-OR 22, whose correlation values Si$_a$, Si$_{a-1}$, ... Si$_0$, ... Si$_{-a}$, are input to each of adders 230. Each of outputs of adders 230 is input to a delay circuit 240 having a delay T, referred to hereinafter as a T-delay circuit) whose outputs Ci$_a$, Ci$_{a-1}$, ... Ci$_0$, ..., Ci$_{-a}$ are returned to adder 23, respectively. Thus, adder 23 and the T-delay circuit 249 locally form an accumulator 260.

The calculation operation of the calculation circuit 7 is continuously repeated so as to meet the always changing transmission condition.

Figure 5:
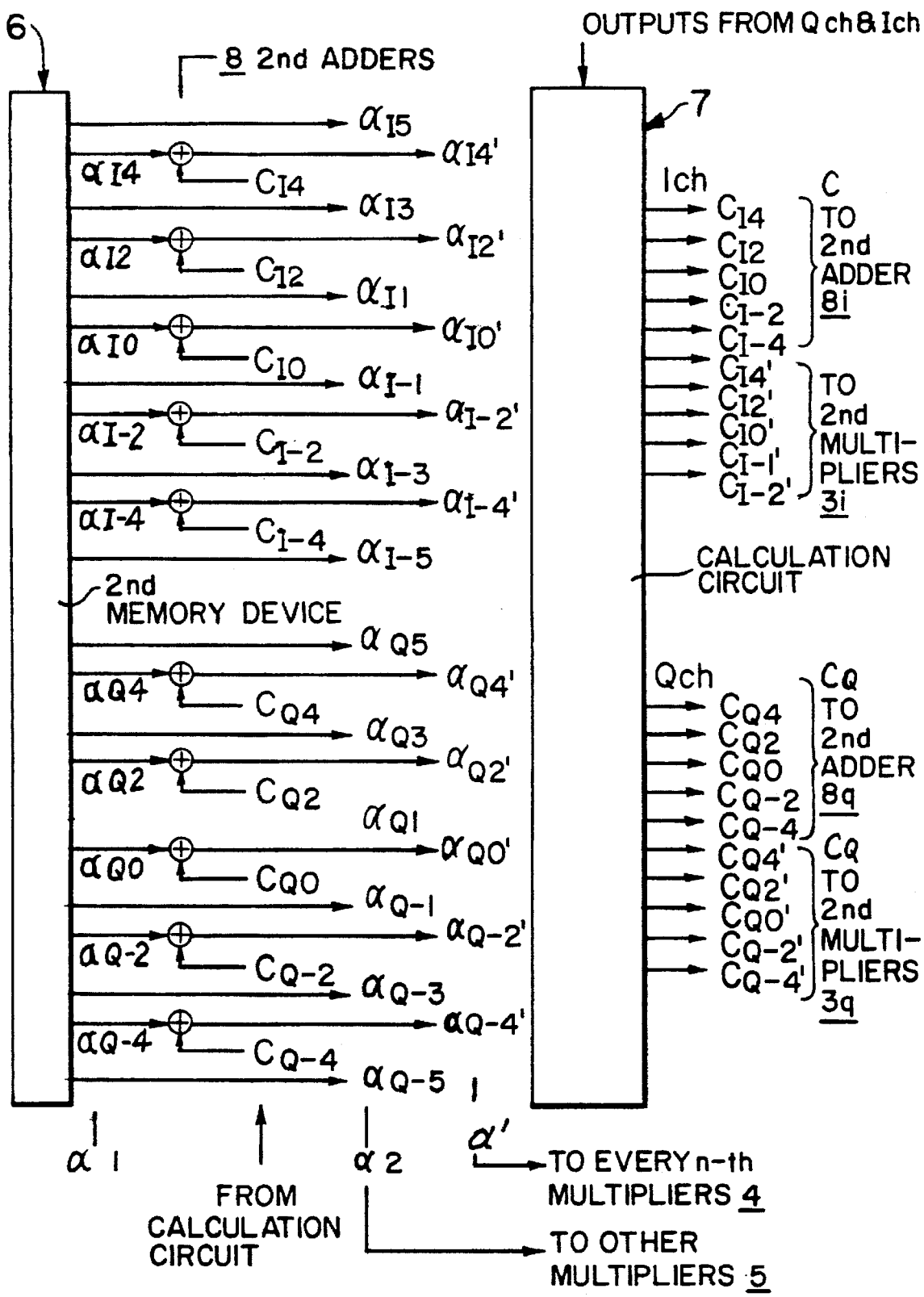
FIG. 5 schematically illustrates tap rating ratios output from a memory device and from a calculation circuit of the first preferred embodiment of the invention.

Though calculation circuit 7 is drawn with a single block in FIG. 5 the content thereof includes four subsidiary calculation circuits, where a first subsidiary calculation circuit is input with the I channel output so as to output fifth group tap rating ratios C, i.e. Ci$_4$—Ci$_{-4}$, a second subsidiary calculation circuit is input with both the I and Q channel outputs so as to output second group tap rating ratios C', i.e. Ci'$_4$—Ci'$_{-4}$, a third subsidiary calculation circuit is input with the Q channel output so as to output fifth group tap rating ratios Cq of the Q channel, i.e. Cq$_4$—Cq$_{-4}$, and a fourth sub calculation circuit is input with the I and Q channel outputs so as to output second group tap rating ratios C'q of the Q channel, i.e. C'q$_4$—C'q$_{-4}$. In FIG. 3, the first and second subsidiary calculation circuits are drawn as a single block 7$i$, and the third and fourth sub calculation circuits are drawn as a single block 7Q. This is similarly done in other figures.

Figure 7:
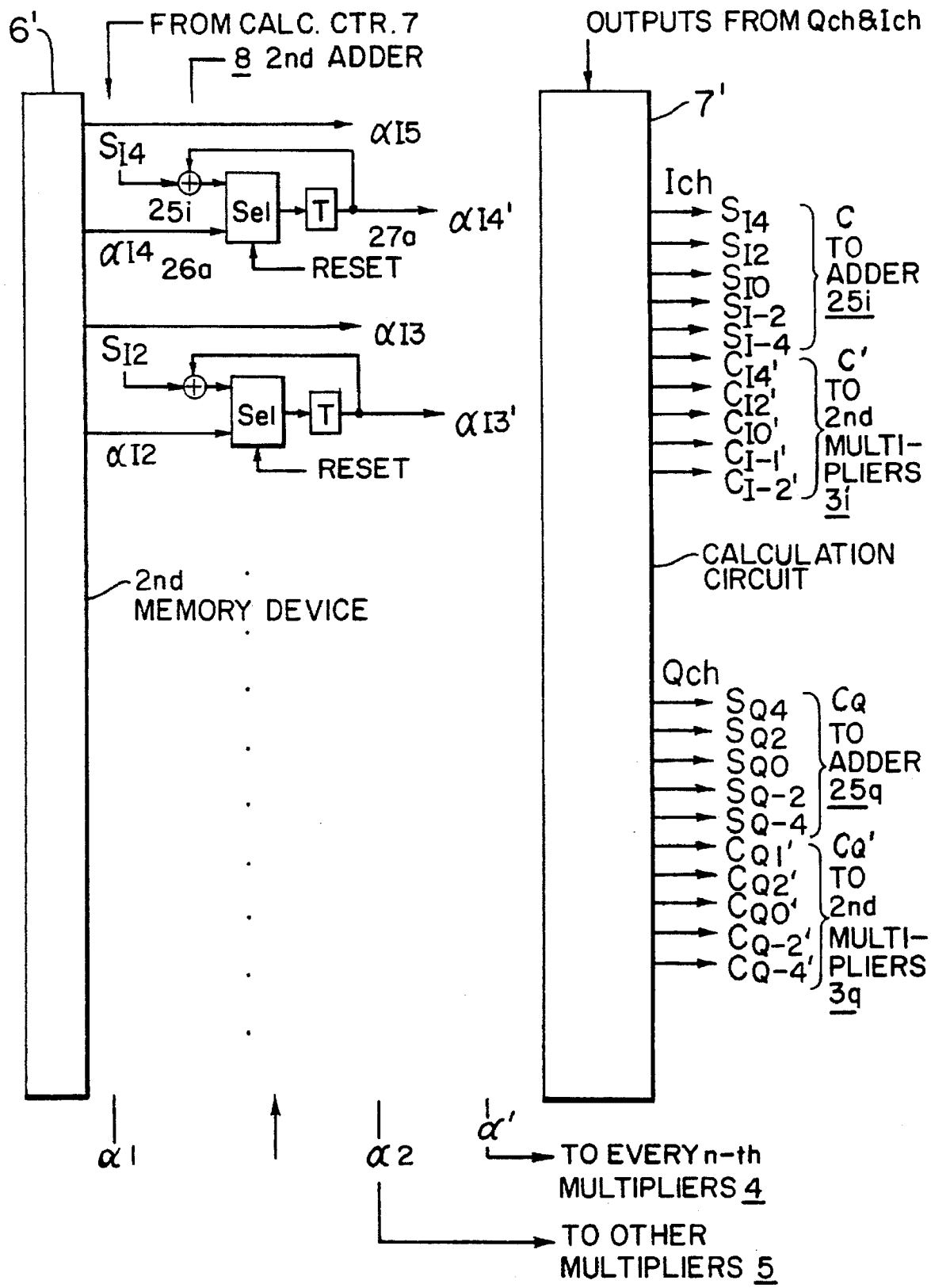
FIG. 7 schematically illustrates tap rating ratios output from a memory device and from a calculation circuit of the second preferred embodiment of the invention.

A second preferred embodiment of the present invention is schematically illustrated in FIG. 7, where second adder 8 is combined with the accumulator shown in FIG. 6, accordingly calculation circuit 7 is modified to be denoted with numeral 7'. Fifth group tap rating ratios; i.e. outputs Si$_a$, Si$_{a-1}$ ... Si$_0$, ... Si$_{-a}$ from calculation circuit 7' are respectively input to adders 25$i$. Outputs of adders 25$i$ are respectively input to a first input terminal of a selection circuit 26$a$. A second input terminal of selection circuit 26$a$ is input with each of the sixth group tap rating ratios $\alpha$1 ($\alpha i_4$, ... $\alpha i_0$, ... $\alpha i_{-4}$) output from memory device 6'. Output of each selection circuit 26$a$ is input to a T-delay circuit 27$a$, whose output is returned to respective adder 25$i$. When selection circuit 26$a$ is reset with its reset terminal, the output of memory 6' is selectively output. When the reset is released, the accumulation operation starts. Then, the outputs $\alpha$'($\alpha i'_4$, ... $\alpha i_0$, ... $\alpha i'_{-4}$) of T-delay circuits 27 are the third group tap rating ratios $\alpha$' described in the first preferred embodiment. Thus, in the second preferred embodiment the circuit configuration can be simple while the reset function is additionally provided.

Figure 8:
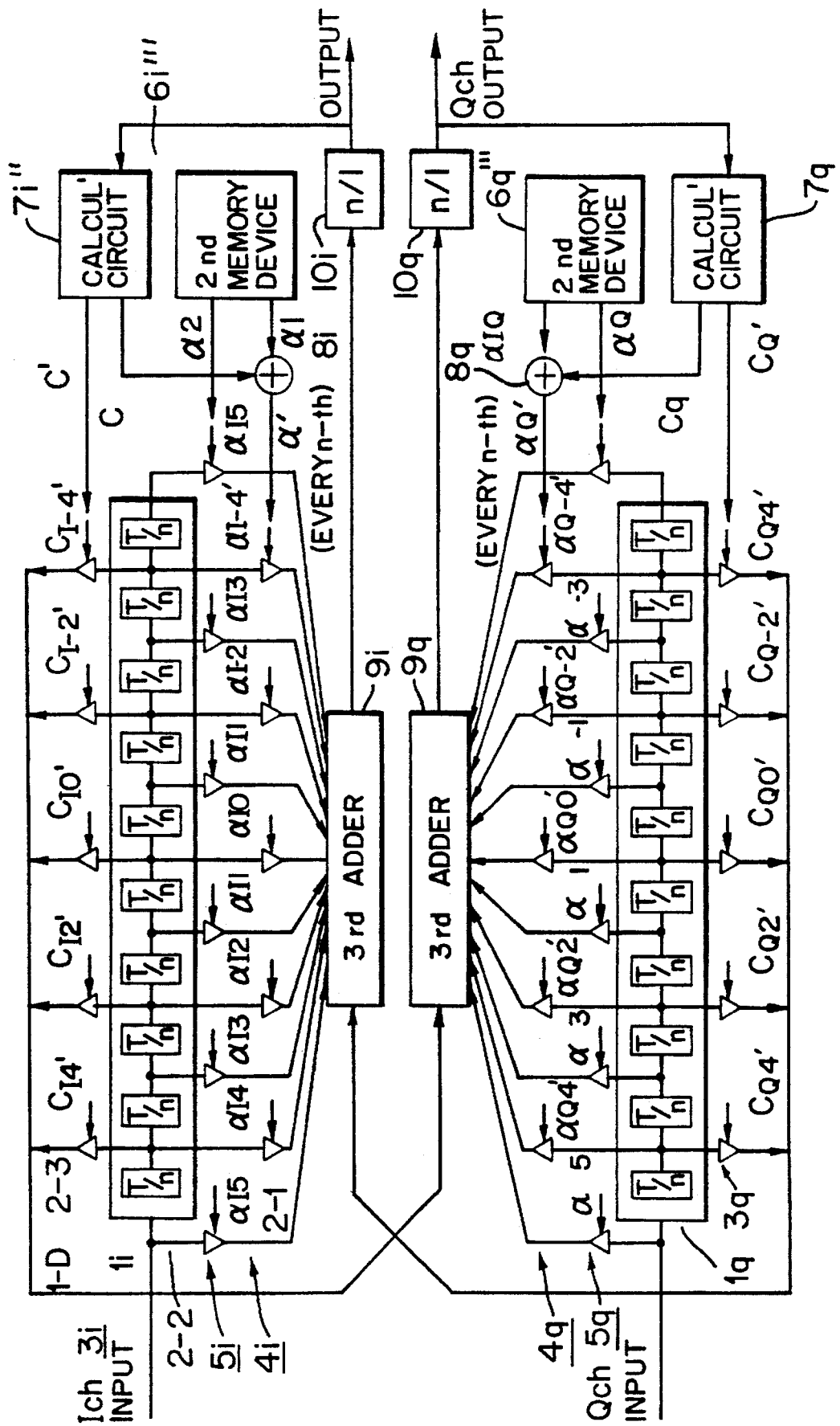
FIG. 8 illustrates a block diagram of a digital roll-off filter of a third preferred embodiment of the present invention.
Figure 9:
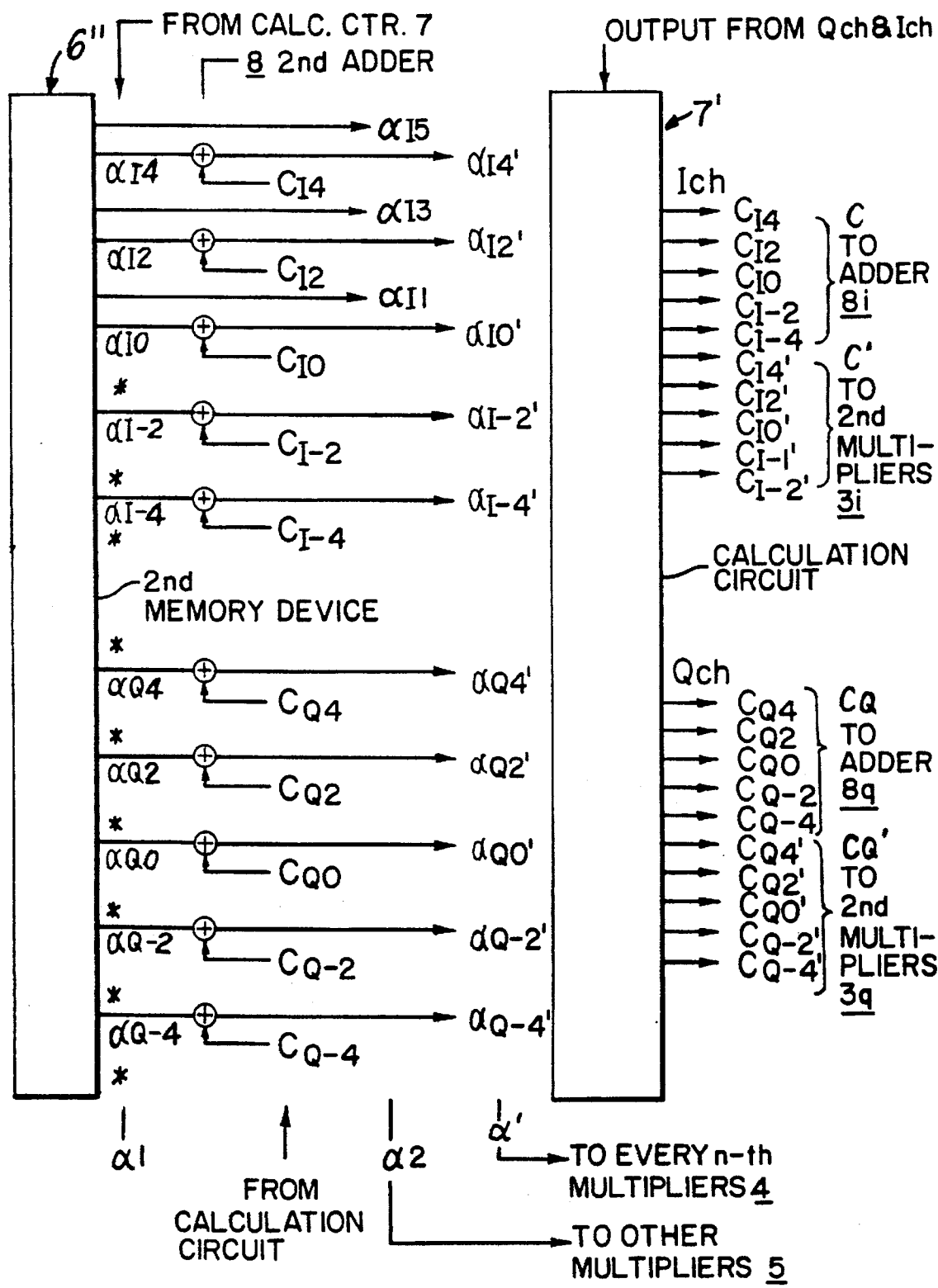
FIG. 9 schematically illustrates tap rating ratios output from a memory device and from a calculation circuit of the third preferred embodiment of the invention.

A third preferred embodiment of the present invention is schematically illustrated in FIG. 8, where only the portion of the second roll-off filter is drawn. As seen in the above preferred embodiments the tap rating ratios are generally symmetric about the center node. Moreover, the I channel and the Q channel are symmetric with each other in principle. Accordingly, the fixed values, i.e. the fourth group tap rating ratios $\alpha$2 ($\alpha i_5$, $\alpha i_3$, $\alpha i_1$) are employed commonly for the first half and the second half of the delay line about the center tap, as well as commonly for the I channel and Q channel. Consequently, the capacity of memory 6" can be reduced. Thus reduced state is shown in FIG. 9, where the marks * indicate the deletion of the memory outputs which existed in FIG. 5.

Figure 10:
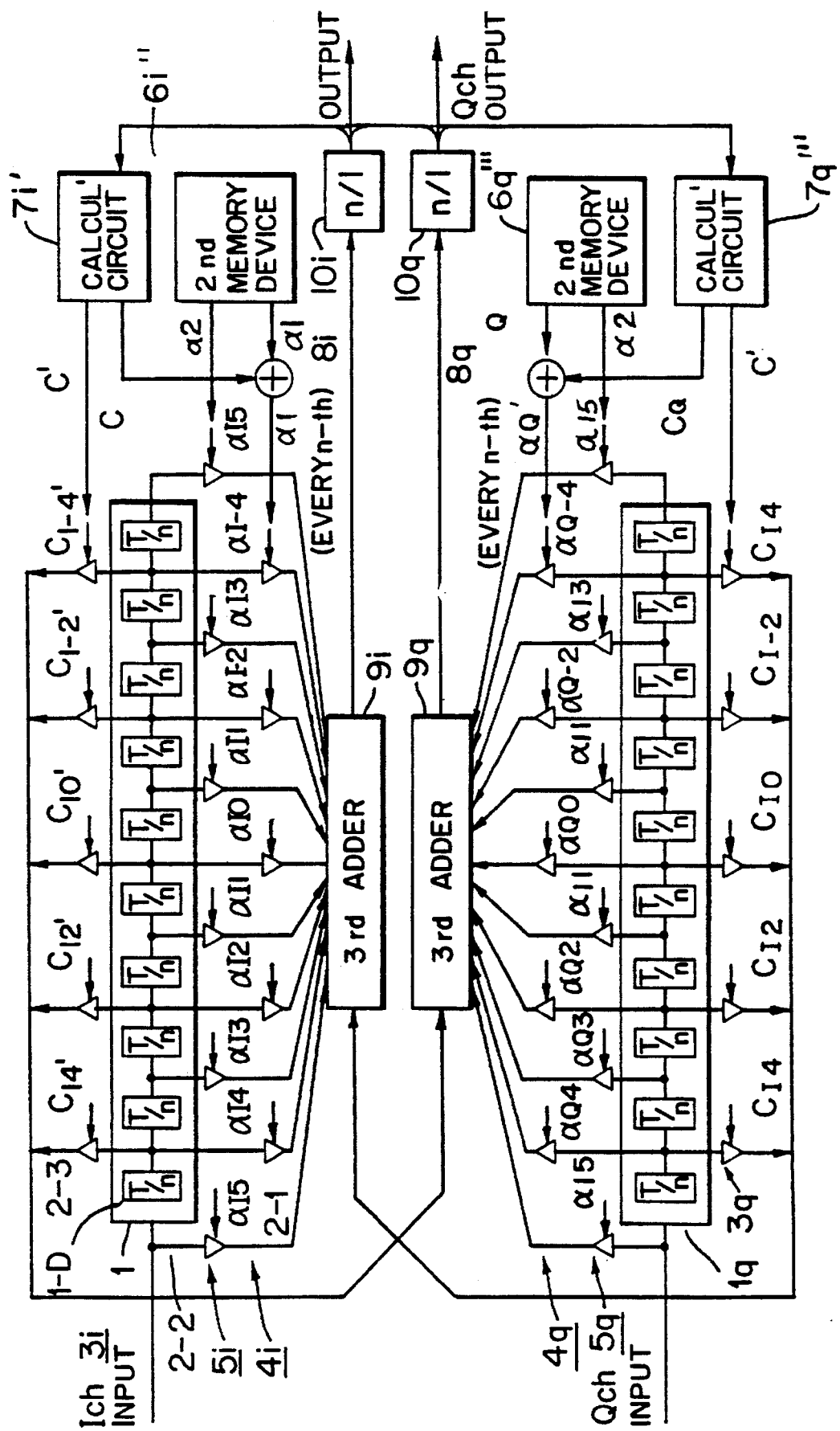
FIG. 10 illustrates a digital roll-off filter of a fourth preferred embodiment of the present invention.
Figure 11:
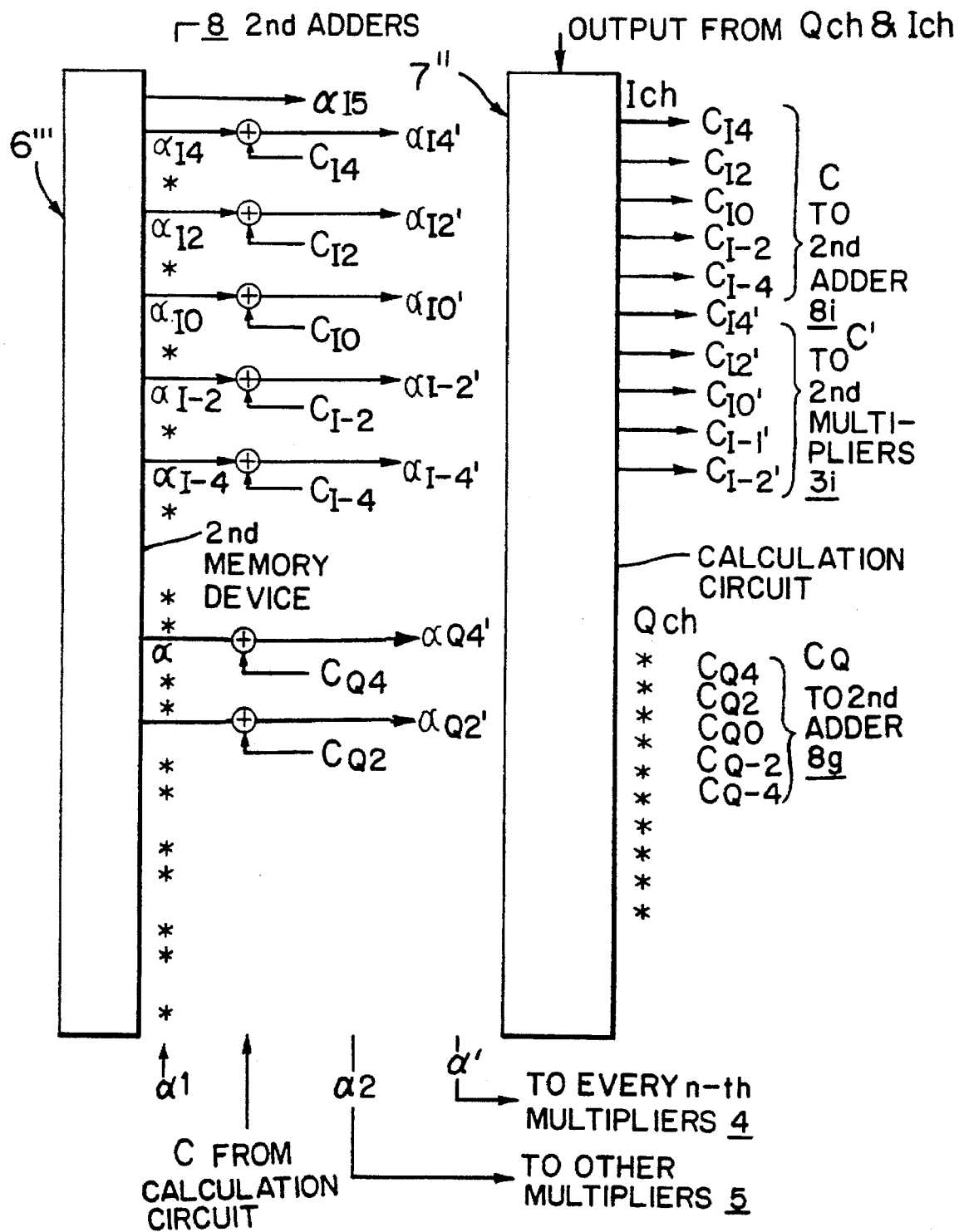
FIG. 11 schematically illustrates tap rating ratios output from a memory device and from a calculation circuit of the fourth preferred embodiment.

A fourth preferred embodiment of the present invention is schematically illustrated in FIG. 10, where only the portion of the second roll-off filter is drawn. The fourth preferred embodiment is to further simplify the circuit configuration for the case where the distortions are equally generated in both I and Q channels, for example, the case where the input to the second roll-off filter is an IF signal. The sixth group tap rating ratios $\alpha$1 ($\alpha i_4$, ... $\alpha i_0$ ... $\alpha i_{-4}$) and second group tap rating ratios C' (C'$_4$, C'$_2$, C'$_0$) in the first preferred embodiment are used commonly for the I and Q channels. The fourth group tap rating ratios $\alpha$2 ($\alpha i_5$, ... $\alpha i_1$ ... $\alpha i_{-5}$) in the first preferred embodiment are used commonly for both the halves about the center node as well as both the I and Q channels. Consequently, the outputs of memory 6''' and calculation circuit 7' can be remarkably reduced. Thus reduced state is shown in FIG. 11, where the marks * indicate the deletion of the memory outputs which existed in FIG. 5.

The quantity of the delay element 1-d in the delay line 1 is determined depending on the required characteristics as a roll-off filter. The quantity of the n-th branches 3 from the nodes of delay line 1 is determined depending on the required characteristics as the automatic equalizer. Accordingly, the quantity of the delay elements and the quantity of the every n-th branches can be arbitrarily chosen as a design choice. The delay elements and the branches must be always symmetric about the center nod.

Figure 12:
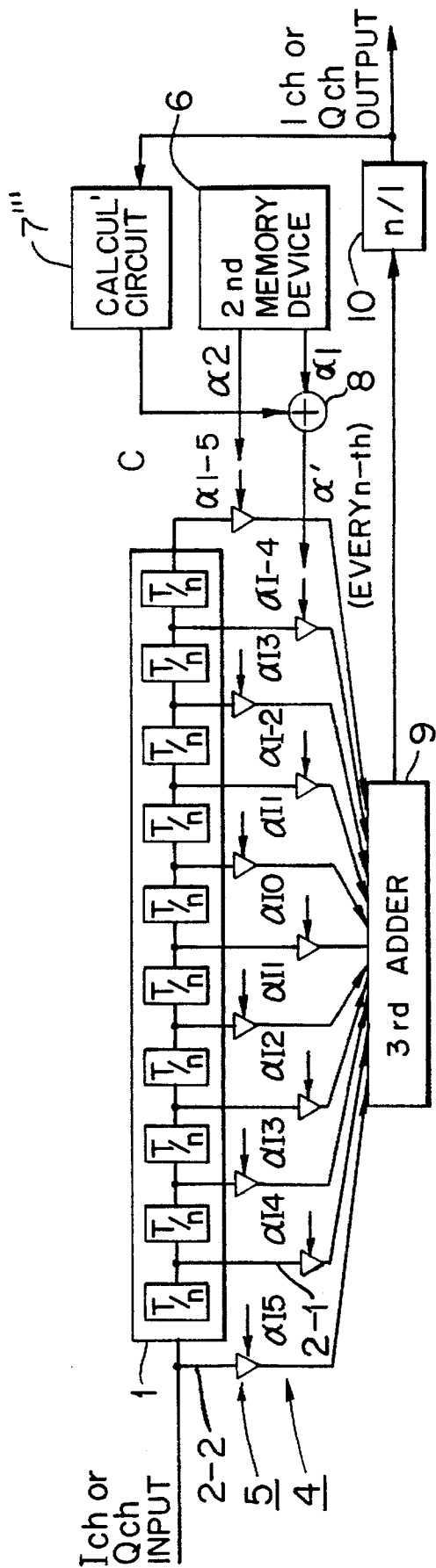
FIG. 12 illustrates a block diagram of a digital roll-off filter of a fifth preferred embodiment of the present invention.

A fifth preferred embodiment of the present invention is hereinafter described referring to FIG. 12, where the cross connection, i.e. the input from the opposite channel, employed in the previous preferred embodiments is deleted. Accordingly, there is none of the second group multipliers 3, and the second group tap rating ratios C' output from calculation circuit. This circuit configuration is widely applicable to a system performing no orthogonal modulation therein.

Figure 13:
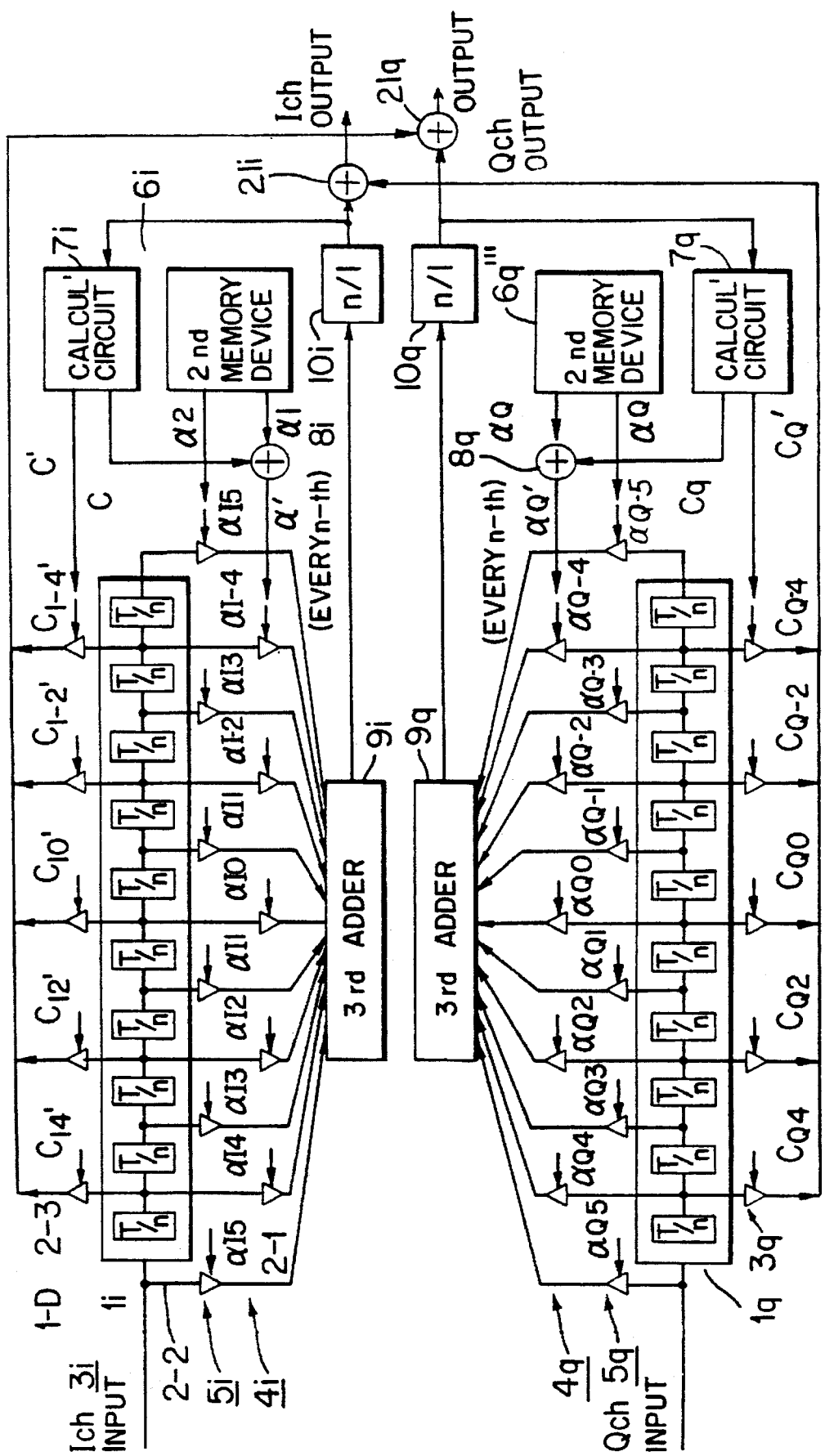
FIG. 13 illustrates a block diagram of a digital roll-off filter of a sixth preferred embodiment of the present invention.

A sixth preferred embodiment of the present invention is hereinafter described referring to FIG. 13, where the third adder circuit 9" has been modified. A fourth adder 21$i$ and 21$q$ are additionally provided at each of the outputs of the roll-off filters of I channel and Q channel of the previous preferred embodiments, respectively. Moreover, the signals output from the second group multipliers 3$i$ of the I channel are input to the fourth adder 21$q$ newly added to the Q channel, instead to third adder 9$q$. In the symmetrical way, the signals output from the second group multipliers 3$q$ of the Q channel are input to the fourth adder 21$i$ newly added to the I channel, instead to third adder 9$q$. Accordingly, third adder 9$i$ sums only the outputs from third and fourth group adders 4$i$ and 5$i$ of the I channel, i.e. own channel. Advantageous effect of this circuit configuration is in that the load of third adder 9 summing so many of the signals input thereto can be eased so as to accomplish a high speed operation.

Figure 14:
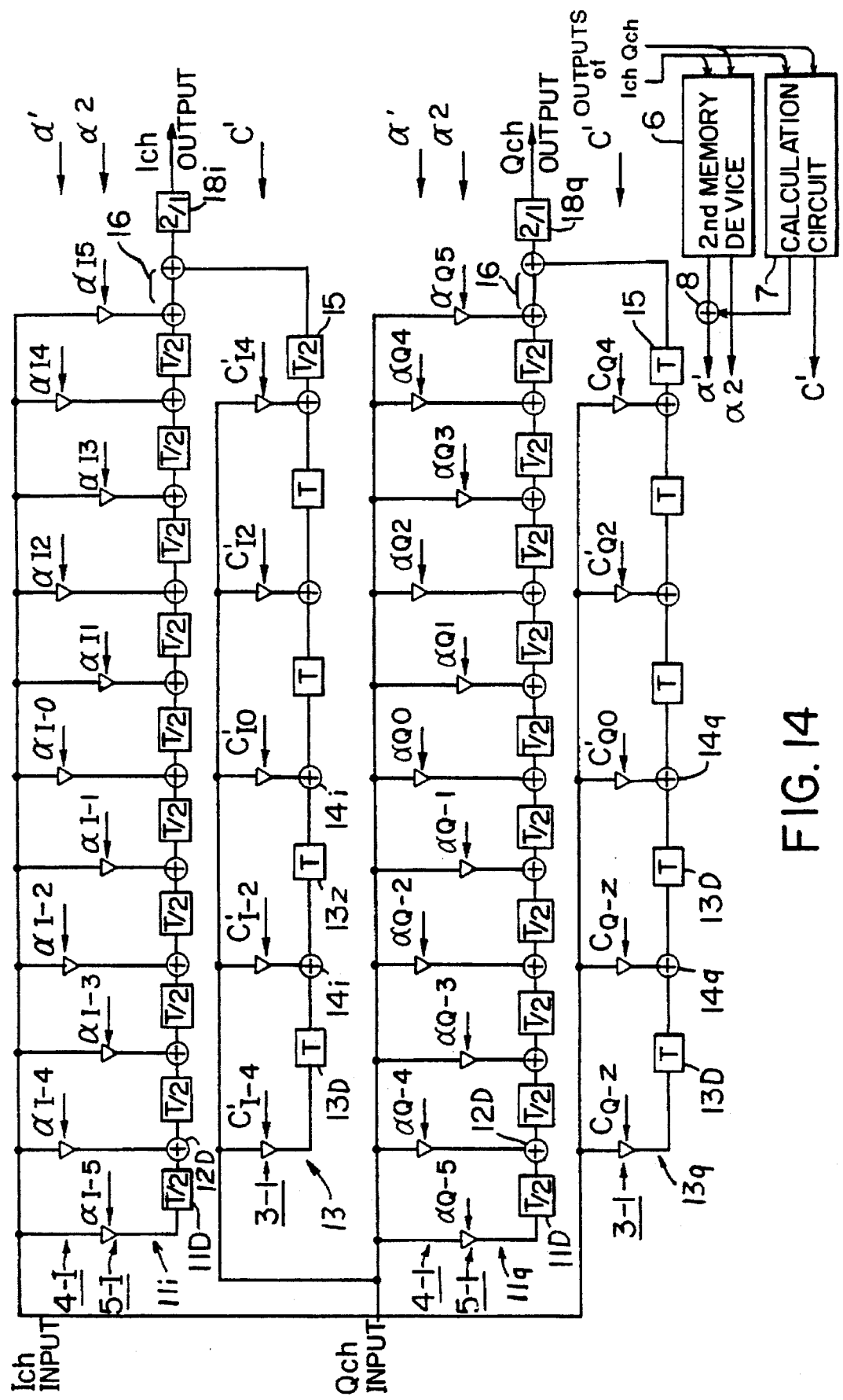
FIG. 14 illustrates a block diagram of a digital roll-off filter of a seventh preferred embodiment of the present invention.

Hereinafter described are modifications of the structure of the second roll-off filter so as to further accomplish a higher speed operation. A seventh preferred embodiment of the present invention hereinafter described referring to FIG. 14. A third transversal type delay line 11 is formed of as many as 2$m$ (an even number, 2$m$=10 in FIG. 14) delay elements 11-D, each having a delay time T/n, typically formed of a flip-flop having the delay time T/n. In FIG. 14 n is chosen two. Between the delay elements 11-D is provided an adder 12D of a fourth group. Between the input terminal of this roll-off filter and each of the fourth group adders 12D are provided multipliers 4-1 and 5-1 of a fifth and sixth group, which are the same as the third and fourth group multipliers 4 and 5 of the previous preferred embodiments. Allocation of the fourth group adders and the fourth and fifth group multipliers are denoted with the suffixes of the previous preferred embodiments. The inputs to the third and fourth group multipliers 4 and 5 from the nodes of the previous preferred embodiments are replaced with the input to the roll-off filter; and outputs of the fifth and sixth multiplier circuits 4-1 and 5-1 are respectively input to the adders 12D of the fourth group. Input to the first delay element is from multiplier $\alpha i_{-5}$. At the output of the last delay element is provided an adder 16D to which an output from the last multiplier circuit whose multiplication factor is $\alpha i_5$ is input. Multiplication factors of the fifth and sixth multipliers are input from second memory device 6 and calculation circuit 7 in the same way as the previous preferred embodiments. Another input to each of the fifth group adder is an output of the adjacent delay element 11-D. Output of each of the fifth group adders is input to the next delay element.

A fourth transversal type delay line 13 is formed of an odd numbers of delay elements 13-D each having a delay time T, typically formed of a flip-flop having the delay time T.

Between the T delay elements 13-D is provided an adder 14 of a fifth group. Between the input terminal of the opposite Q channel roll-off filter and each of the fifth group adders 14i is provided each of multiplier 3-1 of a seventh group, which are the same as the second group multiplier 3 of the previous preferred embodiments. Allocation of the seventh group multipliers 3-1 are denoted with the suffixes of the second group multipliers of the previous preferred embodiments. The inputs to the seventh group multipliers 3-1 from the nodes of the previous preferred embodiments are replaced by the input to the roll-off filter of the opposite channel, i.e. of the Q channel and the outputs of the seventh group multipliers 3-1 are respectively input to the adders 14 of the fifth group.

Multiplication factors to be input to the seventh group multipliers are of the same values (C'i$_{-4}$, ... C'i$_0$, ... C'i$_{-4}$) as the second group multipliers 3 output from the calculation circuit 7 of the previous preferred embodiments. Another input to each of the fifth group adders is an output of the adjacent delay element 13-D. Output of each of the fifth group adders is input to the opposite adjacent delay element. Input to the first delay element of the fourth delay line 13 is from a multiplier to which a multiplication factor C'i$_{-5}$ is input. At the output of the last delay element of the fourth delay line is provided an adder 16 to which a tap rating ratio C'i$_5$ is input from calculation circuit 7. Output of the last adder of the fifth group 14 is input to a delay circuit 15 having a delay time T/2, because n=2 in this preferred embodiment, so that the delay times of the third and the fourth delay lines can be co-phased.

An output from the third delay line 11, i.e. the output from the last adder 16, and an output from the fourth delay line 13, i.e. an output from the T/2 delay element 15, are summed by a sixth adder 17. A pulse train output from sixth adder 17 is divided by n in divider 18 so as to output a pulse train having the symbol rate. An output from the divider 18i is the output of the I channel roll-off filter also acting as an automatic equalizer, of the present invention. A symmetrical circuit configuration is provided for the Q channel, as well.

Figure 15:
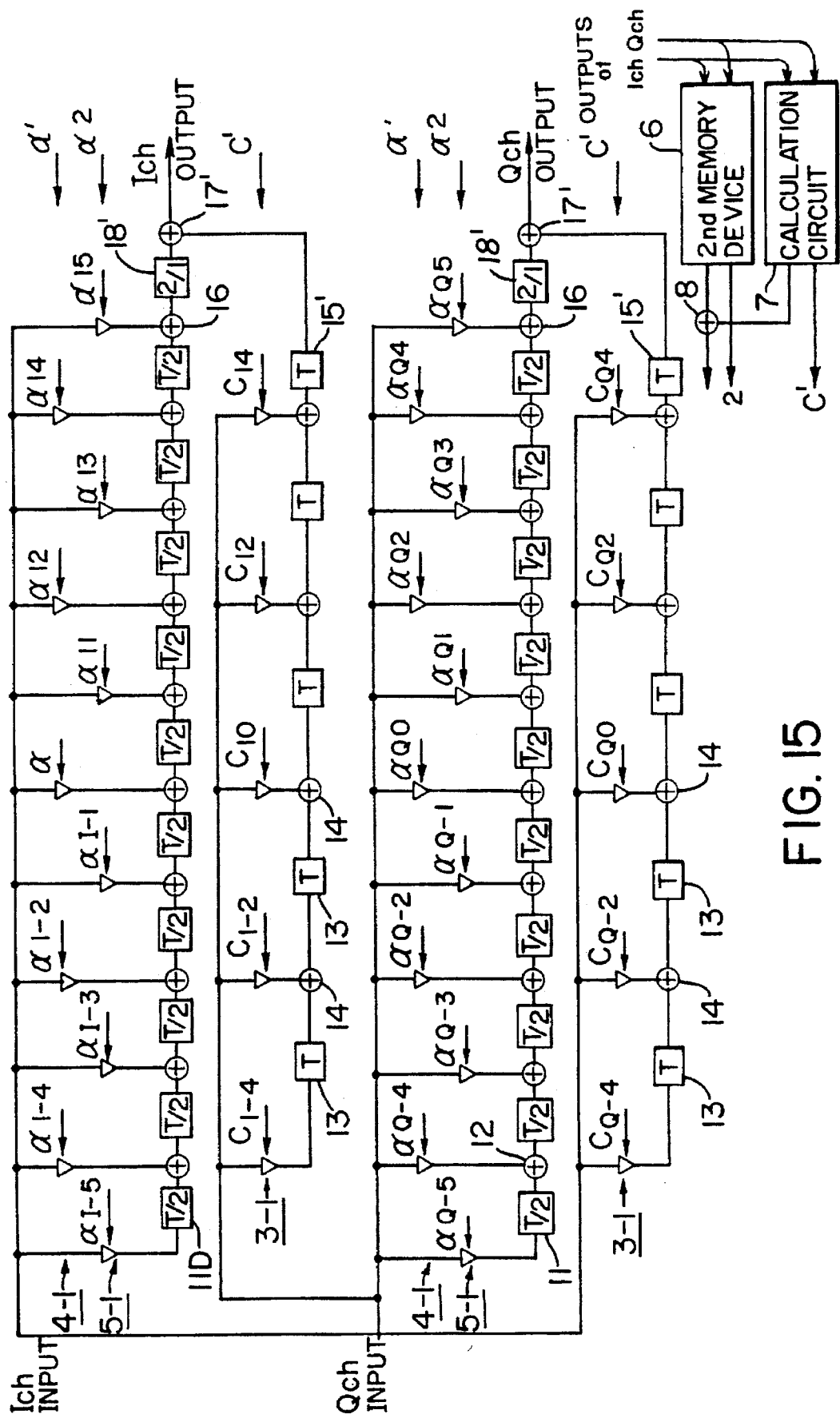
FIG. 15 illustrates a digital roll-off filter of a eighth preferred embodiment of the present invention.

A variation of the seventh preferred embodiment is shown in FIG. 15, as an eight preferred embodiment. The output of the third transversal delay line 13, i.e. the output of the last one 16 of the fourth group adders is input to divider 18'.

Output of the last adder of the fifth group 14 is input to a delay element 15' having a delay time T, so that the delay times of the third and the fourth delay lines are co-phased. An output of divider 18' and the output of the T delay element 15' are summed by an eighth adder 17'. An output from the eight adder 17' is the output of the I channel roll-off filter also acting as an automatic equalizer of the present invention.

Adder circuit 9 in the first to fifth preferred embodiments has to sum so many of the signals input thereto that a considerably large time must be consumed in this summing operation. Advantageous effect of the seventh and eight preferred embodiments is in that the summing operation by adder 9 is sequentially carried out by the distributed fourth and fifth adders. Accordingly, high speed operation can be accomplished.

Figure 1:
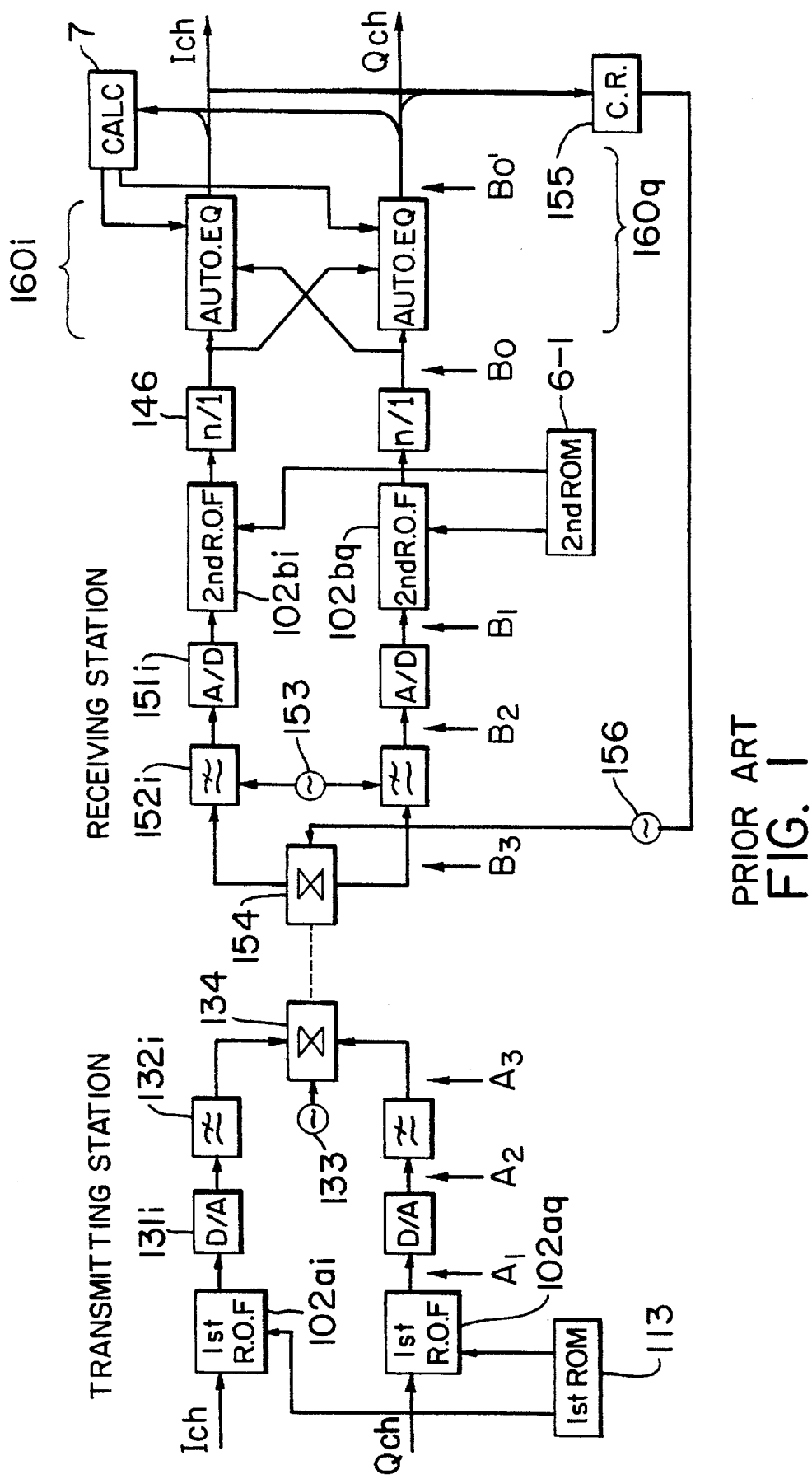
FIG. 1 illustrates a block diagram of circuit of a prior art communication system employing digital roll-off filters and an automatic equalizer.

If the delay line of the seventh or eight preferred embodiment is not employed, the transversal type automatic equalizer circuit 110i has to be placed serially after the second roll-off filter 102bi as was shown in FIG. 1.

In the above preferred embodiment circuit configurations, the delay time spent in passing through the roll-off filter/ automatic equalizer of the present invention is much less than the delay time spent in passing through the serial connection of the second roll-off filter and the automatic equalizer. This is because the delay time to be spent is proportional to the quantity of the serially arranged delay elements through which the signal passes. Thus shortened delay time contributes to solve the problem in that the long delay time in the filter and equalizer deteriorates the effect of the feedback of the carrier regeneration circuit 56 via local frequency oscillator 156 to orthogonal demodulator 154.

Moreover, it is apparent that the circuit configuration in the first to fourth preferred embodiments, having less number of delay element, is much simpler, consequently its production cost is less expensive, than the prior art configuration shown in FIG. 1.

Figure 16:
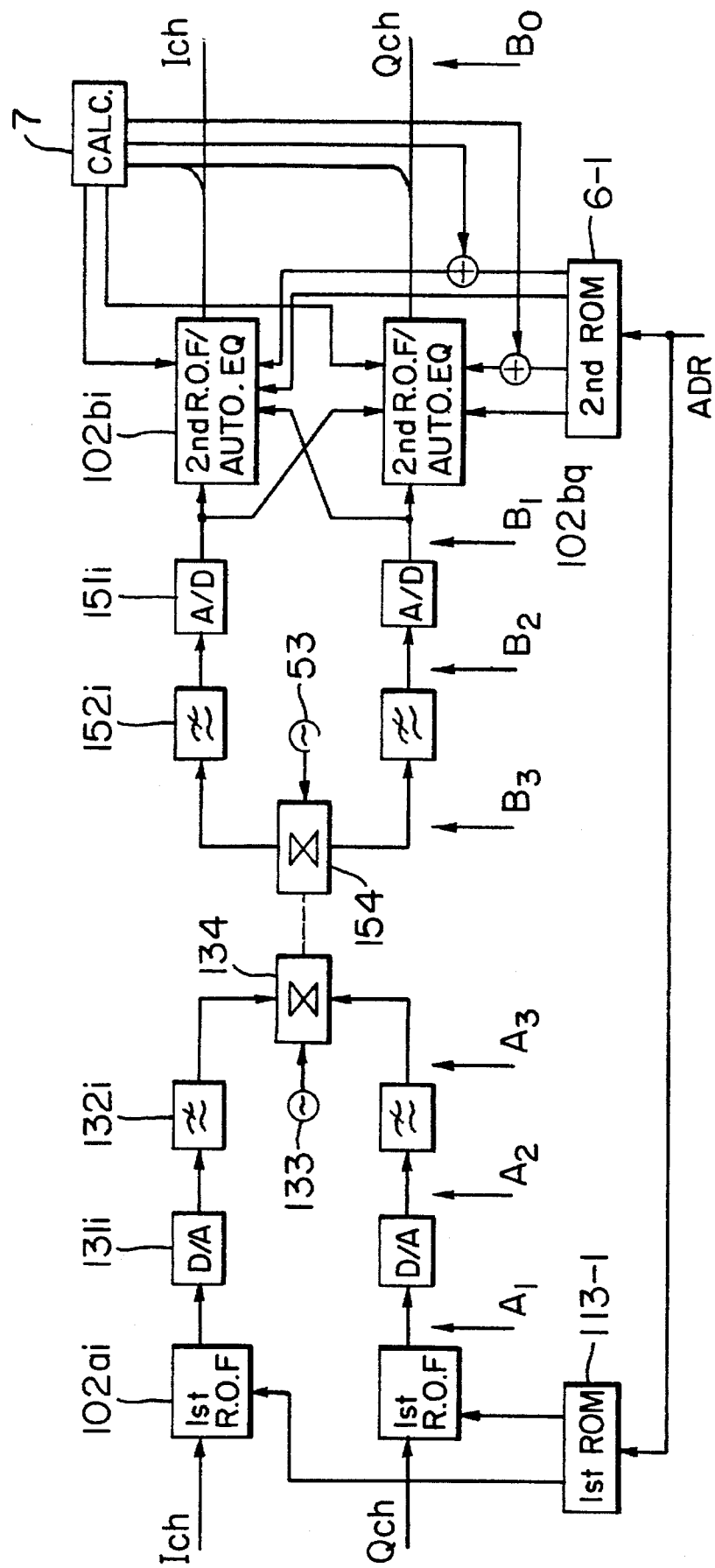
FIG. 16 illustrates a block diagram of a circuit of a system where the method for diagnosing a defect of the circuit according to the present invention.

An ninth preferred embodiment of the present invention is hereinafter described referring to FIG. 16, which is also an abstract summary of the above seven preferred embodiments except below-describe additional feature of two ROMs 113-1 and 6-6, each for determining the frequency characteristics of the first and second roll-off filters 102a and 110. The same numerals denote the same as FIG. 1 and FIG. 3.

As described earlier the frequency characteristics of the roll-off filters are set in advance so that overall frequency characteristics excluding the automatic equalizer function provides at the output of the second roll-off filter such satisfactory pulse forms that no intermodulation takes place between the signals carried on the QAM modulated wave.

Figure 17B:
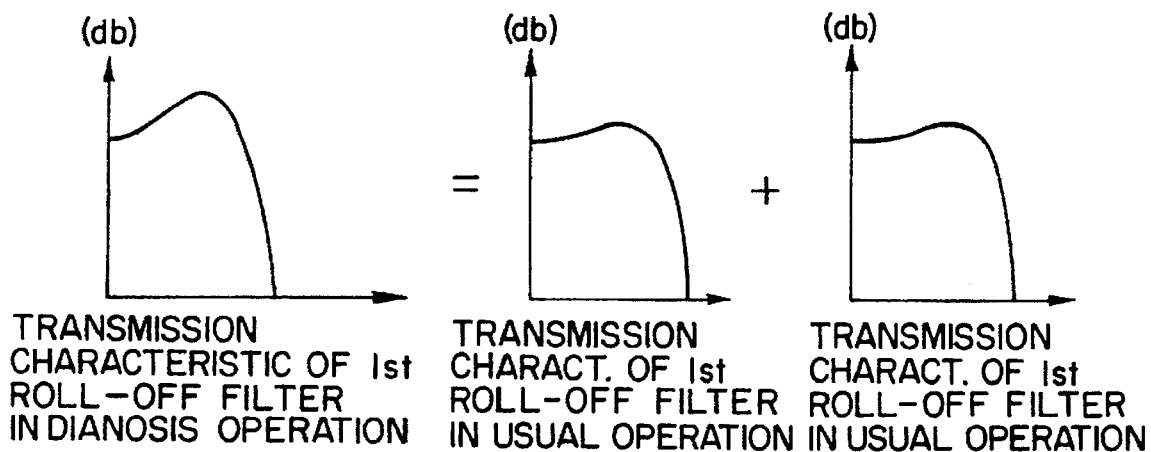
Figure 17C:
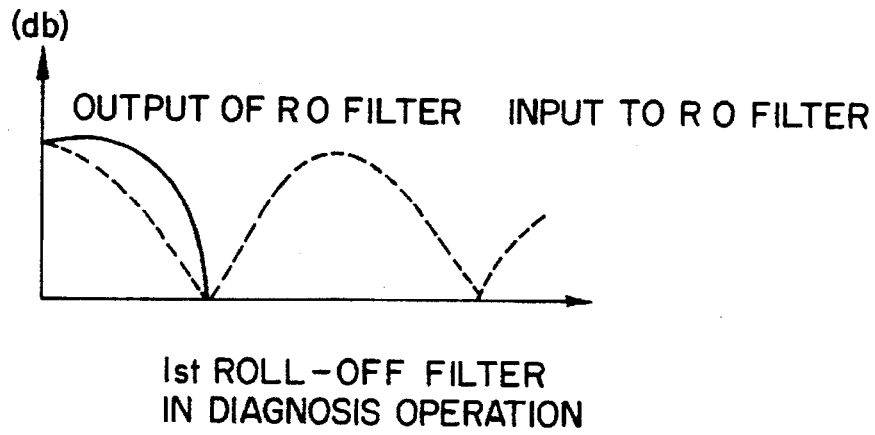

In the ninth preferred embodiment according to the present invention first ROM 113-1 stores at its different addresses two kinds of the tap rating ratios, first kind of which is used for the usual operation as described in connection with the previous preferred embodiments, and the second kind of which is to make the first roll-off filter itself have the above mentioned overall frequency characteristics as illustrated in FIG. 17(b), where the overall frequency preferred characteristics have been shared by 50/50 by the first roll-off filter and the second roll-off filter/equalizer in the previous preferred embodiments. It is seen in FIG. 17(c) the high frequency spectrum within the pass-band of the output signal from the first roll-off filter is enhanced. The second ROM 6-1 in the receiving station has the usual tap rating ratios to be used for the usual operation described in the previous preferred embodiment, and additionally the second kind ones to make the second roll-off filter/equalizer 110i have a flat frequency characteristic, referred to hereinafter as transparent. The tap rating ratios to make the transparent frequency characteristics in the second roll-off filter/equalizer 110i are typically such that only the tap rating ratios input to the central multiplier $\alpha 0$ and C0 are 1 while all other tap rating ratios are set zero. The frequency characteristics taken by each of the roll-off filters will be explained later in detail referring to FIG. 17.

The first and second kinds of the tap rating ratios are switchable to output from the first ROM 113-1 and second ROM 6-1, respectively, by an address switch signal ADR. With the second kind tap rating ratio input to the first roll-off filter, the pulse forms after the output of the first roll-off filter 102ai, i.e. at the check points A1 at the output of the first roll-off filter 102ai, A2 at the output of D/A converter 131i, A3 at the output of first low-pass filter 132i, B3 at the output of demodulator 154i, B2 at the output of second low-pass filter, B1 at the output of A/D converter 151i, and B0 at the output of second roll-off filter 110i, should be of a good shape, unless some cause deteriorates the transmission characteristics.

Figure 18A:
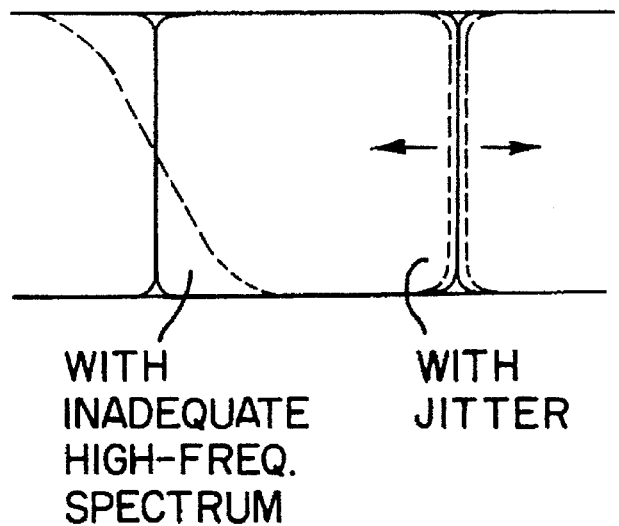
FIG. 18($a$) shows an ideal eye diagram.
Figure 18B:
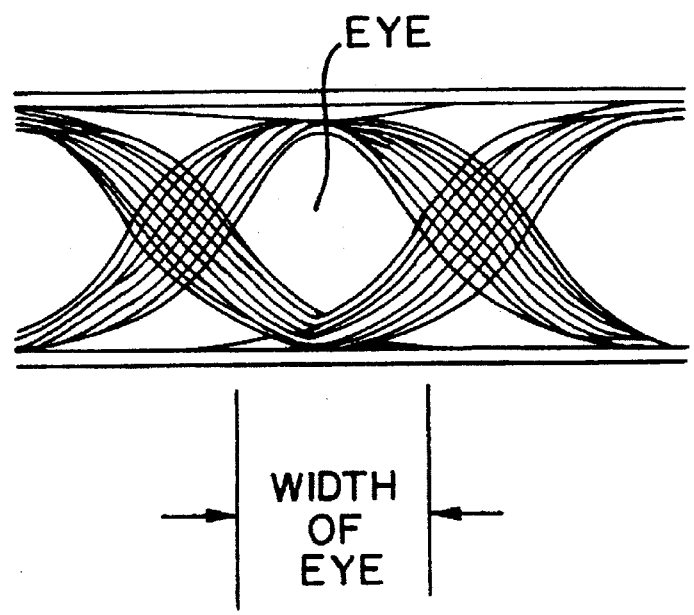

Pulse forms at the check points of the digital signals can be checked by viewing an eye diagram on an oscilloscope. An ideal eye diagram of sequential pulse observed on the oscilloscope is shown with solid lines in FIG. 18(a). If the frequency characteristics is such as to cut high frequency spectrum, the pulse transition exhibits a slope as shown with the dotted line on the left hand side of FIG. 18(a). If jitter takes place, the transitions are dispersed as shown with dotted line on the right hand side of FIG. 18(a). Accordingly, each of the two causes decreases the area of the blank portion, i.e. the eye, in the eye diagram as seen in FIG. 18(b) showing a practical eye diagram. By checking the eye patterns at the check points the cause which has deteriorated the frequency characteristics can be located.

Figure 19A:
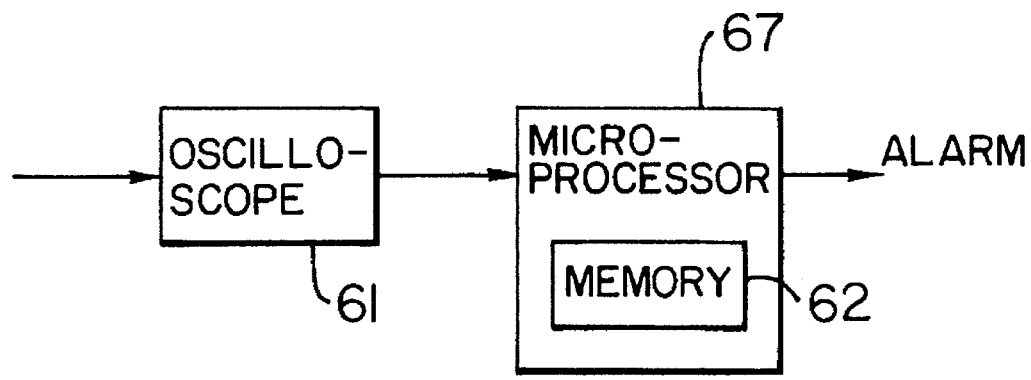
FIG. 19($a$) shows a circuit to detect a deterioration of the pulse forms by an oscilloscope and micro processor.
Figure 19B:
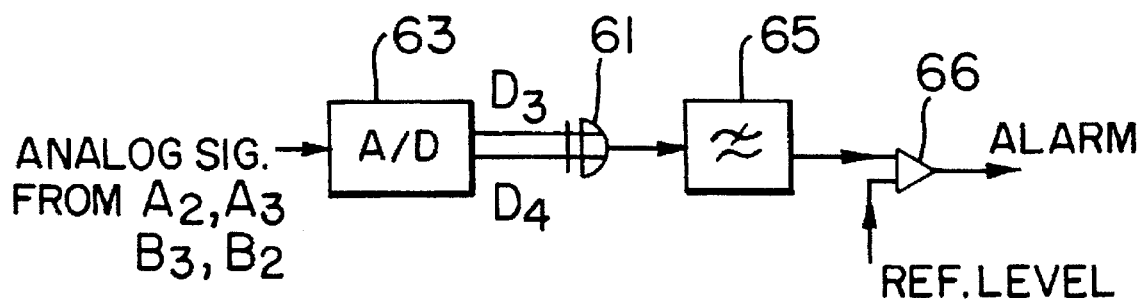
Figure 19C:
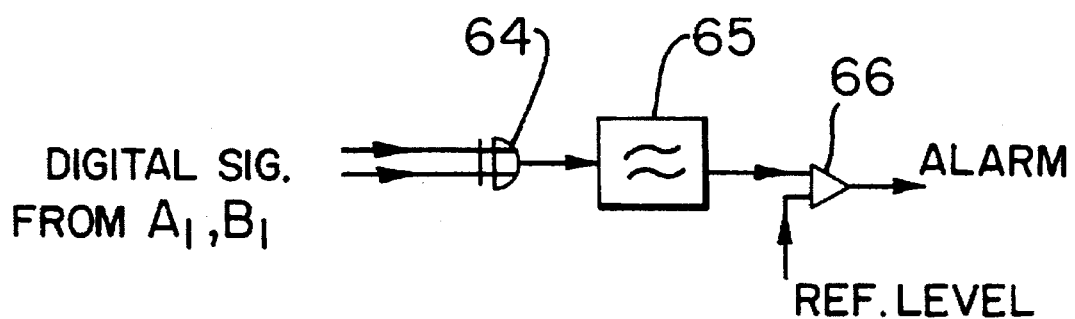

The eye diagram can be observed not only with human eyes via oscilloscope, but also with an electronic means, such as a micro processor. As shown in FIG. 19(a) the micro processor 67 may have in its ROM 62 a reference level with which the value measured on the eye diagram in the oscilloscope 61 is compared so as to detect the cause, i.e. the defect of the circuit. When the comparison result indicates that the eye diagram does not meet the reference level the micro processor outputs an alarm signal. FIGS. 19(b) and (c0 show wired logic for detecting the deterioration. In FIG. 19(b) an analog signal input from the check points A2, A3, B3 or B2 is converted to a digital signal by an A/D converter 63. In this digital signal two error bits, for example D3 and D4, which are located just below data bits D0—D2, in the case of 64 QAM, are input to an exclusive-OR gate 64. The two error bits are averaged by exclusive-OR gate 64 and a low-pass filter 65. Thus averaged output for low-pass filter 65 is compared with a reference level by a comparator 66. When the averaged level exceeds the reference level the comparator outputs an alarm signal. In FIG. 19(c) a digital signal input from the check points A1 or B1 is averaged and processed in the same way by the exclusive-OR 64 and low-pass filter 65 of FIG. 15(b).

Thus, the cause, such as a defect in the electronic circuit, can be easily and quickly located. Without this method of the present invention it is normal for the eye patterns to be deformed, i.e. not adequately open or wide, at those check points even if no defect is in the electronic circuit, because the first roll-off filter itself alone does not provide in the usual operation the full frequency characteristics which provides the good shape of the pulse forms.

A tenth preferred embodiment of the present invention is hereinafter described, which is a variation of the eighth preferred embodiment. The first and second ROMs 113-1 and 6-1 are additionally provided with a third kind of the tap rating ratios. The third kind of the tap rating ratios are such that provide the first roll-off filter with less roll-off ratio, for example 30%, compared with 50% of the ninth preferred embodiment. At this time, the second roll-off filter/equalizer 110i is kept transparent in the same way as the ninth preferred embodiment.

With thus reduced roll-off factor, the eye diagram at the check points completely open in the vertical direction, however, the width in the horizontal direction becomes narrower. Thus narrowed eye diagram emphasizes the phenomena caused from the characteristics deterioration, accordingly allows easier and more accurate detection of the defect.

Though the checking method of the present invention explained above with reference to the eighth and ninth preferred embodiments recites the circuit configuration of the first to eight and ninth preferred embodiments having the second roll-off filter/automatic equalizer 110i, it is apparent that this checking method may be applied to the circuit configuration where the automatic equalizer is provided independently from, and serially to, the second roll-off filter as shown in FIG. 1.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

We claim:

1. A roll-off filter having a function of an automatic equalizer, formed of two finite impulse response type digital filters of which one is input with an I channel signal and another is input with a Q channel signal orthogonal with each other, demodulated from a quadrature amplitude modulation signal formed of a pulse train sampled n times from a pulse signal having a pulse spacing T where n is an integer greater than or equal to 1, said roll-off filter comprising:

a delay line (1) comprising a series connection of an even number of delay elements (1-D) each having a delay time T/n;

branch lines led out from an input terminal to the first delay element of said delay line (1), nodes between adjacent two of said delay elements, and an output terminal of the last delay element of said delay line (1);

a first group of multipliers (4) each serially connected with each of a first group (2-1) of said branch lines, said first group of branch lines being led out from a central one of said nodes and the n-th node counted from said central node;

a second group of multipliers (5) each serially connected with each of a second group (2-2) of said branch lines, said second group of branch lines being led out from all the others of said nodes than those connected with said first group of multipliers (4);

a third group of multipliers (3) each serially connected with each of a third group (2-3) of branch lines led out from those nodes which are connected with said first group of branch lines (2-1);

a memory device (6) for storing and outputting a first group and a second group of tap rating ratios ($\alpha 1$, $\alpha 2$)

to determine a roll-off filter frequency characteristic of the roll-off filter, said second group tap rating ratios (α2) being input to said second group of multipliers (5), respectively;

a calculation circuit (7) for monitoring an output signal of the roll-off filter, calculating according to a predetermined algorithm and outputting a third and a fourth group of tap rating ratios (C', C), each of said third group tap rating ratios (C') being input to each of said third group of multipliers (3), said predetermined algorithm being such that said third and fourth tap rating ratios (C', C) are optimum for the roll-off filter to output pulses of good shape;

a first adder (8) for adding each of said second group tap rating ratios (C) with respective one of said first group tap rating ratios (α1), an output (α2) of said first adder being input to said first group of multipliers (4), respectively; and a second adder (9i) for summing outputs from said first and second group of multipliers and outputs of said third group of multipliers of the opposite channel roll-off filter, wherein an output of said second adder is the output of said roll-off filter.

2. A roll-off filter as recited in claim 1, wherein said first adder (8) comprises an accumulator comprising:

a third adder (25a);

a selecting circuit (26a) receiving an output of said third adder as a first input thereto, receiving said first tap ratio (α1) as a second input thereto, and selecting said second input upon receiving a reset signal; and a second delay circuit (27a) having said delay time T, and receiving an output of said selecting circuit (26a), an output of said second delay circuit (27a) and a correlation value (S) between polarity bit in an input signal to said calculation circuit (7) and error bits being input to said third adder (25a).

3. A roll-off filter as recited in claim 1, wherein said tap rating ratios input to said second group multipliers (5) are common for I channel and Q channel.

4. A roll-off filter as recited in claim 1, wherein said tap rating ratios input to every multipliers (3, 4, 5) are respectively common for I channel and Q channel.

5. A roll-off filter as recited in claim 1, wherein a divider (10i) is provided between said output terminal of said second adder (9) so as to output an output signal having the symbol rate.

6. A roll-off filter as recited in claim 5, wherein a fourth adder (21a) is provided to receive an output of said divider, outputs of second group multipliers (3q) of opposite channel are further input to said fourth adder instead to said second adder (9i), an output of said fourth adder is an output of the roll-off filter.

7. A transversal type roll-off filter having a function of an automatic equalizer, receiving a series bit line of a channel signal of I channel, orthogonal with a Q channel signal, of a digital signal sampled n times from an analog signal demodulated from a quadrature amplitude modulation signal carrying a pulse train having a pulse spacing T, said transversal type roll-off filter comprising:

a first delay line (11) comprising a first even number of first delay elements (11-D) each having a delay time T/n where n is an integer greater than or equal to 1;

a first group of adders (12), each arranged between adjacent two of said first delay elements (11-D) and at an output terminal of the last one of said first delay elements (11-D);

a first group of multipliers (4'), input terminals of said first group of multipliers (4') being connected with an input terminal of the roll-off filter, an output terminal of each of said first group multipliers being respectively input to a central one and every n-th ones counted from said central one of said first group of adders (12), a second group of multipliers (5'), input terminals of said second group of multipliers being connected with said input terminal of the roll-off filter, an output terminal of each of said second group of multipliers (5') being respectively input to all other first group adders (12) than those connected with said first group multipliers (4'), each of said first group adders (12) summing an input from a preceding one of said first delay elements and an input from said first and second group multipliers (4', 5'), an output of each of said first group of adders (12) being input to a subsequent one of said first delay elements (11-D), an output of a first one of said first or second group multipliers (4' or 5') being input to a first one of said first delay elements (11-D);

a second delay line (13) comprising a second even number of second delay elements (13-D) each having a delay time T;

a second group of adders, each arranged between adjacent two of said second delay elements (13-D), one of inputs to each of second group of adders (14) is an output of a preceding one of said second delay elements (13-D), an output of each of said second group of adders (14) being input to a subsequent one of said second delay elements (13-D);

a third delay element (15) having said delay time T/n, connected to an output terminal of the last one of said second group of adders (14), whereby outputs of said first delay line (11) and said second delay line (13) are cophased;

a third group of multipliers (3'), all of input terminals of said third group of multipliers being connected with an input terminal of an opposite (Q) channel roll-off filter, output terminals of said third group of multipliers (3') being respectively input to said second group of adders (14);

a fourth adder provided at an output of a last one (16) of said first adders (12), for summing an output of said third delay element (15) and an output of said last one (16) of said first adders (12);

a memory device (6) for storing and outputting a first group and a second group of tap rating ratios (α1, α2) to determine a roll-off filter frequency characteristic of the roll-off filter, said second group tap rating ratios (α2) being input to said second group multipliers (5'), respectively;

a calculation circuit (7) for monitoring an output signal of the roll-off filter, calculating according to a predetermined algorithm and outputting a third and a fourth group of tap rating ratios (C', C), each of said third group tap rating ratios (C') being input to each of said third group multipliers (3'), said predetermined algorithm being such that said third and fourth tap rating ratios (C', C) are optimum for the roll-off filter to output pulses of good shape;

a third adder (8) for summing each of said third group tap rating ratios (C) with respective one of said first group tap rating ratios (1), outputs (') of said third adders being input to said first group multipliers (4'), respectively; and a divider (18) connected to an output of last one (16) of said first group of adders, for outputting every n-th pulse input thereto;

wherein an output of said pulse divider (18) is an output of the roll-off filter.

8. A transversal type roll-off filter having a function of an automatic equalizer, receiving a serial bit line of a first channel (I channel) signal, orthogonal with a second channel (Q channel) signal, of a digital signal sampled n times from an analog signal demodulated from a quadrature amplitude modulation signal carrying a pulse train having a pulse spacing T where n is an integer greater than or equal to 1, said transversal type roll-off filter comprising:

a first delay line (11) comprising a first even number of first delay elements (11-D) each having a delay time T/n;

a first group of adders (12), each arranged between adjacent two of said first delay elements and at an output terminal of a last one of said first delay elements (11-D);

a first group of multipliers (4'), all of input terminals of said first group of multipliers being connected with an input terminal of the roll-off filter, an output terminal of each of said first group of multipliers being respectively input to a central one and every n-th ones, counted from said central one, of said first group of adders, a second group of multipliers (5'), input terminals of said second group of multipliers being connected with said input terminal of the roll-off filter, an output terminal of each of said second group of multipliers being respectively input to all other adders of said first group of adders than those connected with said first group of multipliers, each of said first group of adders summing an input from a preceding one of said first delay elements and an input from said first and second group of multipliers, an output of each of said first group adders being input to a subsequent one of said first group of adders, an output of a first one of said first or second group of multipliers being input to a first one of said delay elements, a second delay line (13) comprising a second even number of second delay elements (13-D) each having a delay time T;

a second group of adders (14), each arranged between adjacent two of said second delay elements (13-D), and at an output terminal of a last one of said second delay elements (13-D), one of inputs to said second group of adders is an output of a preceding one of said second delay elements, an output of each of said second group of adders being input to a subsequent one of said second delay elements;

a third delay element (15') having said delay time T, connected to an output terminal of the last one of said second group of adders;

a third group of multipliers (3'), input terminals of said third group multipliers being connected with an input terminal of a second channel roll-off filter, output terminals of said third group of multipliers being respectively input to said second group of adders;

a memory device (6) for storing and outputting a first group and a second group of tap rating ratios ($\alpha 1$, $\alpha 2$) to determine a roll-off filter frequency characteristic of the roll-off filter, said second group tap rating ratios (2) being input to said second group of multipliers (5'), respectively;

a calculation circuit (7) for monitoring an output signal of the roll-off filter, calculating according to a predetermined algorithm and outputting a third and a fourth group of tap rating ratios (C', C), each of said third group tap rating ratios (C') being input to each of said third group multipliers (3');

a third adder (8) for summing each of said fourth group tap rating ratios (C) with respective one of said first group tap rating ratios ($\alpha 1$), outputs ($\alpha'$) of said third adder being input to said first group multipliers (4'), respectively;

a divider (18') connected to an output of the last one of said first group of adders (12), for outputting every n-th pulse input thereto; and a fourth adder (17') for summing an output of said last one of said of said first group of adders and an output of said third delay element, wherein an output of said fourth adder (17') is an output of the roll-off filter.

9. A transversal type roll-off filter receiving a serial bit line of a digital signal sampled n times from an analog signal carrying a pulse train having a pulse spacing T where n is an integer greater than or equal to 1, the transversal type roll-off filter comprising:

a transversal type delay line comprising an even number of delay elements each having a delay time T/n;

nodes between adjacent two of said delay elements;

a memory device for providing first tap rating ratios to control signals of said nodes, respectively; and a calculation circuit for monitoring pulse wave forms of an output signal of the roll-off filter, and calculating second tap rating ratios, an addition of each of said second tap rating ratios with corresponding one of said first tap rating ratios additionally controlling an output from a central one of said nodes and every n nodes other than said central node, counted from said central node; said second tap rating ratios being calculated so as to be optimum to make said output pulse forms to be of good shape, wherein said delay line operates as a roll-off filter whose frequency characteristic is determined by said first tap rating ratios and operates as an automatic equalizer whose frequency characteristic is variably controlled by said second tap rating ratios.

10. A roll-off filter as recited in claim 9, wherein the analog signal is of an I channel or a Q channel of QAM modulated signal.

11. A transversal type roll-off filter receiving a serial bit line of a digital signal sampled n times from an analog signal carrying a pulse train having a pulse spacing T where n is an integer greater than or equal to 1, the transversal type roll-off filter comprising:

a first transversal type delay line comprising a plurality of first delay elements each having a delay time T/n;

first nodes, each between adjacent two of said first delay elements;

a second transversal type delay line comprising a plurality of second delay elements each having a delay time T, said second delay line receiving an input from a first delay line of the opposite channel;

second nodes, each between adjacent two of said second delay elements;

a memory device for providing first tap rating ratios to control signals of said first nodes, respectively; and a calculation circuit for monitoring pulse wave forms of an output signal of the roll-off filter, and calculating second tap rating ratios to control signals of said second nodes, an addition of each of said second tap rating ratios with corresponding one of said first tap rating ratios additionally controlling a central one of said nodes, and every n nodes other than said central node, counted from said central node of said first nodes; said second tap rating ratios being calculated so as to be optimum to output said output pulse forms; and an adder to sum outputs of said first and second delay lines, an output of said adder being an output of the roll-off filter, so that said delay lines operate as a roll-off filter having a frequency characteristic determined by said first tap rating ratios and operates as an automatic equalizer having a frequency characteristic variably controlled by said second tap rating ratios.

12. A method of diagnosing electronic circuits used in a communication system, said communication system comprising:

a first digital roll-off filter provided in a transmitting station, comprising:

a first memory device (113-1) for storing and outputting first tap rating ratios to be used for a regular operation of the system and second tap rating ratios to be used to diagnose the system, said first and second tap rating ratios being switchably output to said first digital roll-off filter;

a second digital roll-off filter provided in a receiving station, comprising:

a second memory device (6-1) for storing and outputting third tap rating ratios to be used for said regular operation of the system and fourth tap rating ratios to be used to diagnose the system, said third and fourth tap rating ratios being switchably output to said second digital roll-off filter;

wherein said second tap rating ratios are such that frequency characteristic of said first roll-off filter determined by said second tap rating ratios is the same as an overall frequency characteristic of said first and second roll-off digital filters, the method for diagnosing the system comprising steps of:

switching said first memory device (113-1) so as to selectively output said second tap rating ratios, respectively; and comparing a width or a height of an eye in an eye diagram with a predetermined reference level, at a check point provided at a circuit after said first digital roll-off filter, so as to detect a location of a cause of deteriorating pulse forms, wherein said fourth tap rating ratios are such as to make said second digital roll-off filter transparent to the signal input thereto, and such that tap rating ratios to be input to multipliers connected with a central node are one, and tap rating ratios to be input to multipliers connected with all other nodes than said central node are zero.

13. A method as recited in claim 12, wherein said first memory device further stores and selectively outputs fifth kind tap rating ratios that provide said first roll-off filter with a predetermined frequency characteristics which provides a less roll-off factor than that provided by said second tap rating ratios.

14. A method as recited in claim 12, wherein the communication system is of a QAM modulation.

* * * * *